(12) United States Patent
Chen

(10) Patent No.: US 6,571,368 B1
(45) Date of Patent: May 27, 2003

(54) SYSTOLIC REED-SOLOMON DECODER

(75) Inventor: Yen-Hao Chen, Taichung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/496,564

(22) Filed: Feb. 2, 2000

(51) Int. Cl.$^7$ .................................................. H03M 13/15
(52) U.S. Cl. ....................................... 714/784; 714/785
(58) Field of Search .................................. 714/784, 785

(56) References Cited

U.S. PATENT DOCUMENTS

| | | | | |
|---|---|---|---|---|
| 4,584,686 A | * | 4/1986 | Fritze | 714/762 |
| 4,649,541 A | * | 3/1987 | Lahmeyer | 714/784 |
| 4,747,103 A | * | 5/1988 | Iwamura et al. | 714/755 |
| 4,809,275 A | * | 2/1989 | Inoue et al. | 714/784 |
| 4,845,713 A | * | 7/1989 | Zook | 714/784 |
| 4,958,348 A | | 9/1990 | Berlekamp et al. | 371/37.1 |
| 5,020,060 A | * | 5/1991 | Murai et al. | 714/784 |
| 5,297,153 A | | 3/1994 | Baggen et al. | 371/37.1 |
| 5,323,402 A | * | 6/1994 | Vaccaro et al. | 714/751 |
| 5,325,373 A | * | 6/1994 | Iwamura et al. | 714/784 |
| 5,341,385 A | * | 8/1994 | Shirota | 714/784 |
| 5,444,719 A | * | 8/1995 | Cox et al. | 714/769 |
| 5,517,509 A | | 5/1996 | Yoneda | 371/37.1 |
| 5,715,262 A | | 2/1998 | Gupta | 371/37.1 |
| 5,737,343 A | | 4/1998 | Meyer | 371/37.1 |
| 5,742,620 A | * | 4/1998 | Iwamura | 714/780 |
| 5,805,616 A | * | 9/1998 | Oh | 714/784 |
| 5,818,854 A | * | 10/1998 | Meyer | 714/785 |
| 5,889,793 A | | 3/1999 | Sharma | 371/37.1 |
| 6,263,471 B1 | * | 7/2001 | Huang | 714/784 |
| 6,292,921 B1 | * | 9/2001 | Daoudi et al. | 714/769 |

OTHER PUBLICATIONS

Jyh–Huei Guo and Chin–Liang Wang "Systolic Array Implementation of Euclid's Algorithm for Inversion and Division in GF (2M)" IEEE Transactions on Computers, vol. 47, No. 10, Oct. 1988 (pp. 1161–1167).

Venkatesan Guruswami, Madhu Sudan "Improved Decoding of Reed–Solomon and Algebraic–Geometric Codes" written for Computer Science, MIT (pp. 1–10).

H. T. Kung "Why Systolic Architectures?" Jan. 1982 IEEE Transactions on Computers (pp. 37–46).

Keiichi Iwamura, Yasunori Dohi and Hideki Imai "A Design of Reed–Solomon Decoder With Systolic–Array Structure" IEEE Transactions on Computers, vol. 44, No. 1, Jan. 1995 (pp. 118–122).

Howard M. Shao and Irving S. Reed "On the VLSI Design of a Pipeline Reed–Solomon Decoder Using Systolic Arrays" IEEE Transactions on Computers, vol. 37, No. 10, Oct. 1988.

Howard M. Shao, et al. "A VLSI Design of a Pipeline Reed–Solomon Decoder" IEEE Transactions on Computers, vol. 34, No. 5, May 1985.

Shu Lin, Daniel J. Costello, Jr. "Error Control Coding Fundamentals and Applications" Prentice–Hall, Inc., Chapter 6, 1983 (pp. 141–138).

Stephen B. Wicker, Vijay K. Bhargava "Reed–Solomon Codes and Their Applications" IEEE Communications, Chapter 10, 1994 (pp. 205–241).

* cited by examiner

Primary Examiner—Stephen M. Baker
(74) Attorney, Agent, or Firm—Mark A. Haynes; Haynes Beffel & Wolfeld LLP

(57) ABSTRACT

The present invention includes a method and device useful for decoding a Reed-Solomon (N, K) encoded message of m-bit symbols and corresponding syndromes, where $N<=2^m-1$ and $N-K=2t$. Systolic calculation cells are used, organized to minimize complexity and computation time. Aspects of the invention include designs for syndrome calculation, division of polynomials over a Galois field, applying Euclid's algorithm, partitioning calculation cell arrays to reduce storage requirements, complexity and computation time, and evaluating an error location and polynomial and an error evaluator polynomial.

17 Claims, 23 Drawing Sheets

FIG. 1

|        | $\alpha^2$ | $\alpha$ | 1 |
|--------|-----|---|---|
| 0      | 0 | 0 | 0 |
| 1      | 0 | 0 | 1 |
| $\alpha$ | 0 | 1 | 0 |
| $\alpha^2$ | 1 | 0 | 0 |
| $\alpha^3$ | 0 | 1 | 1 |
| $\alpha^4$ | 1 | 1 | 0 |
| $\alpha^5$ | 1 | 1 | 1 |
| $\alpha^6$ | 1 | 0 | 1 |

FIG. 2

| $\oplus$ | 1 | $\alpha$ | $\alpha^2$ | $\alpha^3$ | $\alpha^4$ | $\alpha^5$ | $\alpha^6$ |
|---|---|---|---|---|---|---|---|
| 1 | 0 | $\alpha^3$ | $\alpha^6$ | $\alpha$ | $\alpha^5$ | $\alpha^4$ | $\alpha^2$ |
| $\alpha$ | $\alpha^3$ | 0 | $\alpha^4$ | 1 | $\alpha^2$ | $\alpha^6$ | $\alpha^5$ |
| $\alpha^2$ | $\alpha^6$ | $\alpha^4$ | 0 | $\alpha^5$ | $\alpha$ | $\alpha^3$ | 1 |
| $\alpha^3$ | $\alpha$ | 1 | $\alpha^5$ | 0 | $\alpha^6$ | $\alpha^2$ | $\alpha^4$ |
| $\alpha^4$ | $\alpha^5$ | $\alpha^2$ | $\alpha$ | $\alpha^6$ | 0 | 1 | $\alpha^3$ |
| $\alpha^5$ | $\alpha^4$ | $\alpha^6$ | $\alpha^3$ | $\alpha^2$ | 1 | 0 | $\alpha$ |
| $\alpha^6$ | $\alpha^2$ | $\alpha^5$ | 1 | $\alpha^4$ | $\alpha^3$ | $\alpha$ | 0 |

FIG. 3

| $\otimes$ | 1 | $\alpha$ | $\alpha^2$ | $\alpha^3$ | $\alpha^4$ | $\alpha^5$ | $\alpha^6$ |
|---|---|---|---|---|---|---|---|
| 1 | 1 | $\alpha$ | $\alpha^2$ | $\alpha^3$ | $\alpha^4$ | $\alpha^5$ | $\alpha^6$ |
| $\alpha$ | $\alpha$ | $\alpha^2$ | $\alpha^3$ | $\alpha^4$ | $\alpha^5$ | $\alpha^6$ | 1 |
| $\alpha^2$ | $\alpha^2$ | $\alpha^3$ | $\alpha^4$ | $\alpha^5$ | $\alpha^6$ | 1 | $\alpha$ |
| $\alpha^3$ | $\alpha^3$ | $\alpha^4$ | $\alpha^5$ | $\alpha^6$ | 1 | $\alpha$ | $\alpha^2$ |
| $\alpha^4$ | $\alpha^4$ | $\alpha^5$ | $\alpha^6$ | 1 | $\alpha$ | $\alpha^2$ | $\alpha^3$ |
| $\alpha^5$ | $\alpha^5$ | $\alpha^6$ | 1 | $\alpha$ | $\alpha^2$ | $\alpha^3$ | $\alpha^4$ |
| $\alpha^6$ | $\alpha^6$ | 1 | $\alpha$ | $\alpha^2$ | $\alpha^3$ | $\alpha^4$ | $\alpha^5$ |

FIG. 4

$$\begin{array}{r}
\alpha^5 x^2 + \alpha^0 x + \alpha^0 \phantom{xxxxxxxxxxx}\\
x^4 + \alpha^3 x^3 + x^2 + \alpha x + \alpha^3 \overline{\smash{\big)}\, \alpha^5 x^6 + \alpha^3 x^5 + \alpha^6 x^4 \phantom{xxxxxxxxxxxx}}\\
\underline{\alpha^5 x^6 + \alpha x^5 + \alpha^5 x^4 + \alpha^6 x^3 + \alpha x^2}\\
\alpha^0 x^5 + \alpha x^4 + \alpha^6 x^3 + \alpha x^2 \phantom{xxxx}\\
\underline{\alpha^0 x^5 + \alpha^3 x^4 + \alpha^0 x^3 + \alpha x^2 + \alpha^3 x}\\
\alpha^0 x^4 + \alpha^2 x^3 + 0 x^2 + \alpha^3 x \phantom{xxx}\\
\underline{\alpha^0 x^4 + \alpha^3 x^3 + \alpha^0 x^2 + \alpha x + \alpha^3}\\
\alpha^5 x^3 + \alpha^0 x^2 + \alpha^0 x + \alpha^3
\end{array}$$

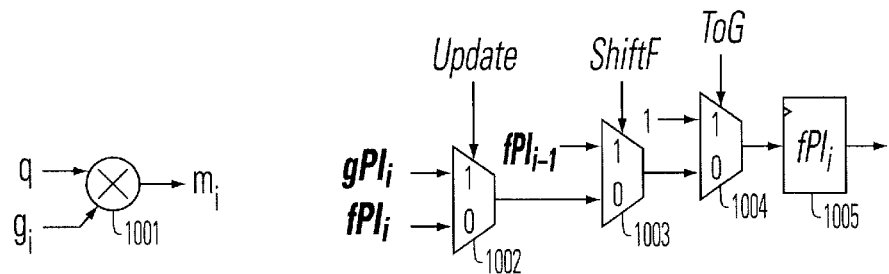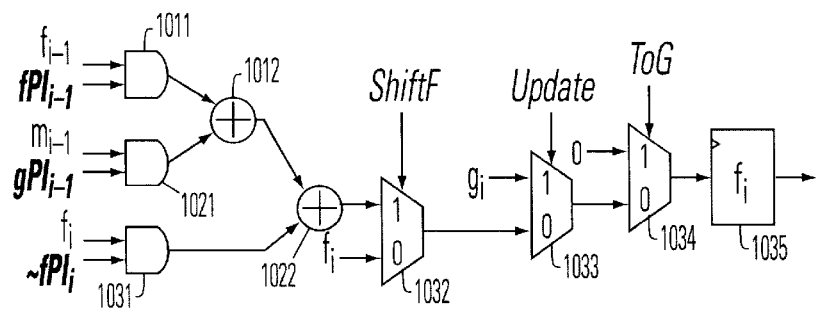
FIG. 10
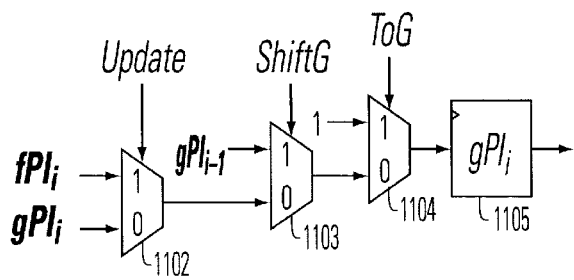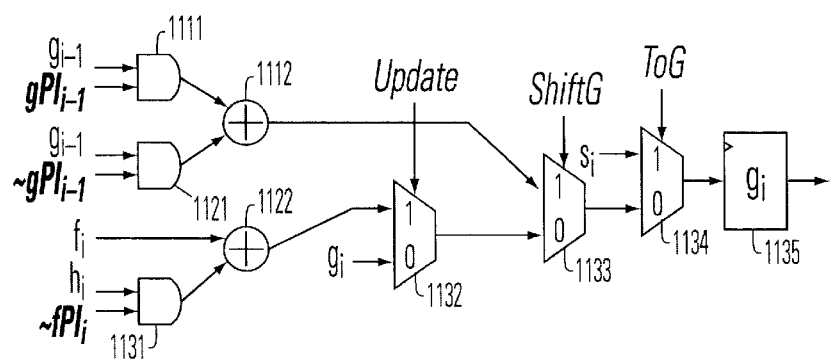
FIG. 11

| | o | p | q | r | s | t | u | v | w | x |
|---|---|---|---|---|---|---|---|---|---|---|
| clock | ⎍ | ⎍ | ⎍ | ⎍ | ⎍ | ⎍ | ⎍ | ⎍ | ⎍ | ⎍ |
| ToEval | ⎍ | | | | | | | | | |
| $EnX_i$ | | ⎍ | ⎍ | ⎍ | ⎍ | ⎍ | ⎍ | ⎍ | | |
| $EnX_{2i}$ | | ⎍ | ⎍ | ⎍ | ⎍ | ⎍ | ⎍ | ⎍ | ⎍ | |
| $\omega_0$ | X | X | $\alpha^2$ | $\alpha^2$ | $\alpha^2$ | $\alpha^2$ | $\alpha^2$ | $\alpha^2$ | $\alpha^2$ | $\alpha^2$ |
| $\omega_1$ | X | X | $\alpha^3$ | $\alpha^3$ | $\alpha^3$ | $\alpha^3$ | $\alpha^3$ | $\alpha^3$ | $\alpha^3$ | $\alpha^3$ |
| $\lambda_0$ | X | X | 1 | 1 | 1 | 1 | 1 | 1 | 1 | 1 |
| $\lambda_1$ | X | X | $\alpha^5$ | $\alpha^5$ | $\alpha^5$ | $\alpha^5$ | $\alpha^5$ | $\alpha^5$ | $\alpha^5$ | $\alpha^5$ |
| $\lambda_2$ | X | X | $\alpha^4$ | $\alpha^4$ | $\alpha^4$ | $\alpha^4$ | $\alpha^4$ | $\alpha^4$ | $\alpha^4$ | $\alpha^4$ |
| $x_i$ | $\alpha$ | $\alpha$ | $\alpha$ | $\alpha^2$ | $\alpha^3$ | $\alpha^4$ | $\alpha^5$ | $\alpha^6$ | 1 | $\alpha$ |
| $x_{2i}$ | $\alpha^2$ | $\alpha^2$ | $\alpha^2$ | $\alpha^4$ | $\alpha^6$ | $\alpha$ | $\alpha^3$ | $\alpha^5$ | 1 | $\alpha^2$ |
| $\alpha_{\omega 1}$ | $\alpha$ | $\alpha$ | $\alpha$ | $\alpha$ | $\alpha^2$ | $\alpha^3$ | $\alpha^4$ | $\alpha^5$ | $\alpha^6$ | 1 |
| $\alpha_{\omega 0}$ | $\alpha$ | $\alpha$ | $\alpha$ | $\alpha$ | $\alpha$ | $\alpha^2$ | $\alpha^3$ | $\alpha^4$ | $\alpha^5$ | $\alpha^6$ |
| $\alpha_{\lambda 2}$ | $\alpha^2$ | $\alpha^2$ | $\alpha^2$ | $\alpha^2$ | $\alpha^4$ | $\alpha^6$ | $\alpha$ | $\alpha^3$ | $\alpha^5$ | 1 |
| $\alpha_{\lambda 0}$ | $\alpha^2$ | $\alpha^2$ | $\alpha^2$ | $\alpha^2$ | $\alpha^2$ | $\alpha^4$ | $\alpha^6$ | $\alpha$ | $\alpha^3$ | $\alpha^5$ |
| $\alpha_{\lambda 1}$ | $\alpha^2$ | $\alpha^2$ | $\alpha^2$ | $\alpha^2$ | $\alpha^2$ | $\alpha^4$ | $\alpha^6$ | $\alpha$ | $\alpha^3$ | $\alpha^5$ |
| $\Omega_1(x)$ | X | X | X | $\alpha^3$ | $\alpha^3$ | $\alpha^3$ | $\alpha^3$ | $\alpha^3$ | $\alpha^3$ | $\alpha^3$ |
| $\Omega_0(x)$ | X | X | X | X | $\alpha$ | $\alpha^3$ | 1 | $\alpha^6$ | $\alpha^4$ | 0 |
| $\Lambda_{even2}(x)$ | X | X | X | $\alpha^4$ | $\alpha^4$ | $\alpha^4$ | $\alpha^4$ | $\alpha^4$ | $\alpha^4$ | $\alpha^4$ |
| $\Lambda_{even0}(x)$ | X | X | X | X | $\alpha^2$ | $\alpha^3$ | $\alpha$ | $\alpha^4$ | 0 | $\alpha^6$ |
| $\Lambda_{odd1}(x)$ | X | X | X | $\alpha^5$ | $\alpha^5$ | $\alpha^5$ | $\alpha^5$ | $\alpha^5$ | $\alpha^5$ | $\alpha^5$ |
| $\Lambda(x)$ | X | X | X | X | 1 | $\alpha$ | 0 | $\alpha$ | $\alpha^3$ | $\alpha^3$ |
| $E(x)$ | X | X | X | X | 0 | 0 | $\alpha^2$ | 0 | 0 | 0 |

FIG. 29

SYSTOLIC REED-SOLOMON DECODER

BACKGROUND OF THE INVENTION

A Reed-Solomon code is an algebraic transformation for encoding a message so that it can be sent through a noisy environment and recovered accurately, even though errors are introduced into the message. Reed-Solomon codes have been used for wide variety of applications such as satellite communications, compact disc playback and asynchronous digital subscriber line ("ADSL") communications. A discussion of the wide range of applications for Reed-Solomon codes is found in Stephen B. Wicker and Vijay K. Bhargava, *Reed-Solomon Codes and Their Applications* (IEEE Press 1994).

The mathematical foundation for Reed-Solomon encoding is a finite field known as a Galois Field ("GF"). An introduction to finite field algebra is found in Shu Lin and Daniel J. Costello, Jr., *Error Control Coding: Fundamentals and Applications*, pp. 15 et seq. (Prentice-Hall 1983) ("Lin & Costello"). A Galois Field of $2^m$ elements ("GF($2^m$)") is generated from a "primitive" polynomial. Adding or multiplying two of the largest elements of the field together produces a smaller element, because the field is finite. Galois Field GF($2^m$) addition is modulo-2 addition and is indicated by $\oplus$.

Reed-Solomon encoding takes place in a field of $2^m$ elements. A Reed-Solomon encoded message is divided into code words or segments of $2^m-1$ or fewer symbols, each symbol represented by m bits. A code word having fewer than $2^m-1$ symbols is referred to as a shortened code. The "symbols" represent elements of the finite field which, after a fashion, can be added or multiplied together. By one convention, the elements of the field are denoted $0, 1, \alpha, \alpha^2 \ldots \alpha^{2^m-2}$, where $\alpha$ and the primitive polynomial p(x) are related by the equation $p(\alpha)=0$.

One of the useful properties of a Reed-Solomon code is that it is well adapted to parallel processing. Efforts have been made to design parallel processors or systolic arrays to decode Reed-Solomon codes, including efforts by Shao and Reed. Howard M. Shao, T. K. Truong, Leslie J. Deutsch, Joseph H. Yueng and Irving S. Reed, "A VLSI Design of a Pipeline Reed-Solomon Decoder," IEEE Transactions on Computers, Vol. C-34, No. 5, pp. 393–401 (May 1985); Howard M. Shao and Irving S. Reed, "On the VLSI Design of the Reed-Solomon Decoder Using Systolic Arrays," IEEE Transactions on Computers, Vol. C-37, No. 10, pp. 1273–78 (October 1988). Another well-known decoder was designed by Elwyn Berlekamp and his colleagues. Elwyn Berlekamp, Gadiel Seroussi, Po Tong, "A Hypersystolic Reed-Solomon Decoder," Chapter 10 in Wicker & Bhargava, *Reed-Solomon Codes and Their Applications*, p. 205 et seq. ("Chapter 10"); E. R. Berlekamp, G. Seroussi, and P. Tong, Hypersystolic Reed-Solomon Decoder, U.S. Pat. No. 4,958,348, issued Sep. 18, 1990.

Reed-Solomon decoding generally involves four steps. In the first two steps, a syndrome polynomal S(x) is generated and the key equation $\Lambda(x)S(x)=\Omega(x) \mod x^{2t}$ is solved to obtain an error location polynomial $\Lambda(x)$ and an error evaluator polynomial $\Omega(x)$. Step three is to evaluate these polynomials to determine which symbols are affected by errors and what are the error values, resulting in an error polynomial E(x). Finally, the error polynomial is combined with the received polynomial R(x) (which is buffered during steps one to three) to produce a reconstructed message without errors.

One of the tools for generating error location and error evaluator ploynomals is Euclid's algorithm. However, Euclid's algorithm involves division in a finite field or multiplication by a multiplicative inverse. A significant contribution of Shao and Reed was to implement a modified Euclid's algorithm to find an error-location polynomial without computation of inverse elements. Berlekamp uses cross-multiplication instead of division in his extended Euclid's algorithm. Chapter 10, pp. 221–22. In addition, Berlekamp introduces a "hypersystolic" architecture, by which he means that clock signals are part of the data that passes from one computation cell to another, thereby reducing the dependence of parallel processing computation cells on synchronized propagation of a clock signal. Use of cross-multiplication increases processing time or the number of multipliers required in each cell. Hypersystolic architecture increases the number of steps required to produce a result, as data passes in a special serial sequence up and down each of Berlekamp's towers and from one tower to the next, twice through each cell.

An advantageous design would directly apply Euclid's algorithm using a single divider, sharing the results, and thereby minimizing the number of dividers required. A shared divider design for the second step of Reed-Solomon decoding would enable parallel processing of each symbol or term of a code word. The number of clock cycles required to apply Euclid's algorithm would be minimized, resulting in either faster processing or use of a slower clock speed with resulting cost reductions.

Another aspect of an advantageous design would be to evaluate both the error location and error evaluator polynomial simultaneously in a minimum number of cycles. The overall objective is to minimize the complexity and number of computation cells, thereby reducing the foot print of the decoder circuit, reducing its cost and speeding signal processing.

SUMMARY OF THE INVENTION

One aspect of the present invention is a method and device for calculation of syndromes, useful in decoding a Reed-Solomon (N, K) encoded message with m-bit symbols, including a set of 2t syndrome calculation cells coupled to inputs and outputs, where the syndrome calculation cells include a syndrome register coupled to an output, a constant multiplier with its input coupled to the syndrome register, an adder with inputs coupled to the serial input and the constant multiplier, and a mux with its inputs coupled to "0" and to the adder and its output coupled to the syndrome register, where the mux is responsive to a syndrome calculate signal.

A second aspect of the present invention is a method and device to divide polynomials over a Galois Field, useful in decoding a Reed-Solomon (N, K) encoded message with m-bit symbols, including a dividend polynomial array of first cells, the first cells coupled with the next lower order first cell, a divisor polynomial array of second cells, the second cells coupled with the next lower order second cell, a shared divider for calculating the highest order first cell divided by the highest order second cell, its output coupled to the first cells, and logic to calculate a quotient of the highest order first cell divided by the highest order second cell and a remainder polynomial of the dividend polynomial minus said quotient times the divisor polynomial. The present invention is adapted to produce a quotient and remainder in a single clock cycle. It may include a product polynomial array of third cells, the third cell coupled to its next lower order third cell and to the shared divider. The present invention can be practiced with only one multiplier per first cell and no multipliers in the second and third cells.

Another aspect of the present invention is a method and device to apply Euclid's algorithim to decode a Reed-Solomon (N, K) encoded message of m-bit symbols and corresponding syndromes, where $N<=2^m-1$ and $N-K=2t$, including a dividend polynomial array of first cells, the first cells coupled to the next lower order first cells, a divisor polynomial array of second cells, the second cells coupled to the same and next higher order first cells and to the next lower order second cell, an array of third cells, the third cell coupled to the same order first and second cells and to the next lower order third cell, a shared divider with its inputs coupled to the highest order first and second cells and its output coupled to the first cells, and logic to calculate a quotient of the highest order first cell divided by the highest order second cell and a remainder polynomial of the dividend polynomial minus said quotient times the divisor polynomial.

Yet another aspect of the present invention is a method and device to apply Euclid's algorithm to decode a Reed-Solomon (N, K) encoded message of m-bit symbols and corresponding syndromes S(x), where $N<=2^{m-1}$ and $N-K=2t$, including arrays of first, second and third cells, a shared divider coupled to the array, which divides the highest order first and second cells and outputs a quotient to the first cells, logic to partition the first cells to represent polynomials $\Omega^{(k-2)}(x)$ and $\Lambda^{(k-2)}(x)$ and to partition the second cells to represent polynomials $\Omega^{(k-1)}(x)$ and $\Lambda^{(k-1)}(x)$, where k is an index of iteration, and logic to calculate $\Lambda^{(k)}(x)=\Lambda^{(k-2)}(x)-[Q^{(k)}(x)\otimes\Lambda^{(k-1)}(x)]$ and $\Omega^{(k)}(x)=\Omega^{(k-2)}(x)-[Q^{(k)}(x)\otimes\Omega^{(k-1)}(x)]$, where $Q^{(k)}(x)=\Omega^{(k-2)}(x)\oslash\Omega^{(k-1)}(x)$. Initial values used at k=1 should be $\Lambda^{(-1)}(x)=0$, $\Lambda^{(0)}(x)=1$, $\Omega^{(-1)}(x)=x^{2t}$, and $\Omega^{(0)}(x)=S(x)$. The logic to calculate should iterate until the degree of the of $\Omega^{(k-1)}(x)<t$. The present invention can be practiced with only one multiplier per first cell and no multipliers in the second or third cells. Moreover, the first cells include logic which exercises the multiplier only once to calculate said difference.

A further aspect of the present invention is a method and device for decoding Reed-Solomon (N, K) encoded messages with m-bit symbols, where $N<=2^{m-1}$ and $2t=N-K$, including an array of first cells, logically partitioned into $\Omega^{(i-2)}$ and $\Lambda^{(i-2)}$ cells, said first cells coupled to adjacent first cells, an array of second cells, logically partitioned into $\Omega^{(i-1)}$ and $\Lambda^{(i-1)}$ cells, said second cells coupled to corresponding and next higher order first cells and to adjacent second cells, an array of third cells, said third cells coupled to the corresponding first and second cells and to adjacent third cells, a shared divider coupled to first cells, logic associated with the first, second and third cells to calculate a quotient $q=\Omega^{(i-2)}/\Omega^{(i-1)}$ and a remainder of the quotient, logic associated with the first, second and third cells to calculate $\Omega^{(i)}=\Omega^{(i-2)}-Q^{(k)}\Omega^{(i-1)}$ and logic associated with the first, second and third cells to calculate $\Lambda^{(i)}=\Lambda^{(i-2)}-Q(k)\Lambda^{(i-1)}$.

An additional aspect of the present invention is a method and device for evaluating a t+1-term error location polynomial and a t-term error evaluator polynomial useful for decoding Reed-Solomon (N, K) encoded messages with m-bit symbols, where $N<=2^{m-1}$ and $2t=N-K$, including an array of $\Omega$ cells initialized with an error location polynomial, an array of $\Lambda$ cells initialized with an error evaluator polynomial, said array of $\Lambda$ cells including $\Lambda$even and $\Lambda$odd sub arrays, a first constant factor generator coupled to the highest order cell of the $\Omega$ array, a second constant factor generator coupled to the highest order cell of the $\Lambda$even and $\Lambda$odd sub arrays, logic to pass first constant factors values serially through the $\Omega$ array cells and to evaluate $\Omega(x)$ at values of $x^k$ generated by the first constant factor generator, where k is an index of iteration, and logic to pass second constant factors serially through both the $\Lambda$even array and the $\Lambda$odd array and to evaluate $\Lambda$even$(x^2)$ and $\Lambda$odd$(x^2)$ at values of $x^{2k}$ generated by the second constant factor generator. This aspect of the invention may further include logic evaluate $\Lambda(x)=\Lambda$even$(x^2)+x$ $\Lambda$odd$(x^2)$ at $x^{2k}$ and, when $\Lambda(x)=0$ to evaluate $E(x)=\Omega(x)/\Lambda$odd$(x^2)$.

When various aspects of the present invention are combined, the method and device may include a device for decoding Reed-Solomon (N, K) encoded messages with m-bit symbols, where $N<=2^{m-1}$ and $2t=N-K$, comprising syndrome calculation means for calculating a syndrome polynomial of a received Reed-Solomon (N, K) encoded message, an array of 2t+1 first cells, logically partitioned into $\Omega(i-2)$ and $\Lambda(i-2)$ cells, said first coupled to adjacent first cells, an array of second cells, logically partitioned into $\Omega(i-1)$ and $\Lambda(i-1)$ cells, said second cells receiving the syndrome polynomial from the syndrome calculation means and being coupled to the corresponding and next higher order first cells and to adjacent second cells, an array of third cells, said third cells coupled to the first and second cells and to adjacent the third cells, a shared divider coupled to the first and third cells, logic associated with the first, second and third cells to apply Euclid's algorithm and generate an error location and an error value polynomial, Chien search means for identifying elements of $GF(2^m)$ which are roots of the error location polynomial, coupled to the logic to generate an error location polynomial, and error evaluation means for evaluating the error value polynomial at roots of the error location polynomial, coupled to the logic to generate an error value polynomial and to the Chien search means.

BRIEF DESCRIPTION OF THE FIGURES

FIGS. 1–4 introduce a Galois Field over $2^3$ ("$GF(2^3)$"), with elements 0 through $\alpha^6$. FIG. 1 depicts the vector representation of the elements of this field. FIGS. 2 and 3 are an addition and multiplication matrix for this Galois Field. FIG. 4 is an example of division with a quotient and remainder.

FIGS. 10–12 are logic diagrams for calculation cells used to apply Euclid's algorithm, first, second and third cells, respectively.

FIGS. 27–29 are a first example of how an architecture embodying the principles of the present invention processes a Reed-Solomon encoded message. FIG. 29 is syndrome polynomial S(x) generation.

FIGS. 30–32 are a second example, parallel to the first. Note that these figures depict the processing of two received codewords, the first being the same codeword as in the first example and the second received codeword being subject to an error which invokes the ShiftG control signal.

DETAILED DESCRIPTION OF FIGURES

FIGS. 1–4 provide a simplified introduction to operations in a finite field. In general, elements of a finite field can alternatively be represented as powers of α, as a polynomial, or as a vector. FIG. 1 shows the alternative representations for elements of a field consisting of $2^3$ or 8 elements and having the primitive polynomial $p(x)=x^2+x+1$. For instance, element $\alpha^6=\alpha^2+0\alpha+1$ and can be represented by the vector or tuple (1, 0, 1). FIG. 2 is an addition table for elements of the field. Any element added to itself is "0". Addition is a matter of XORing together the bits of the vector representation for the elements being added. For instance, $\alpha+\alpha^3$ is (0, 1, 0) XOR (0, 1, 1). The result is 1 or (0, 0, 1). FIG. 3 is a multiplication table for elements of the field. Division in a finite field, illustrated in FIG. 4, often results in a quotient and a remainder. The remainder of i$\div$j is i mod j. A more complete review of field properties and operations is found in Lin & Costello, pp. 15 et seq.

Figure 5:
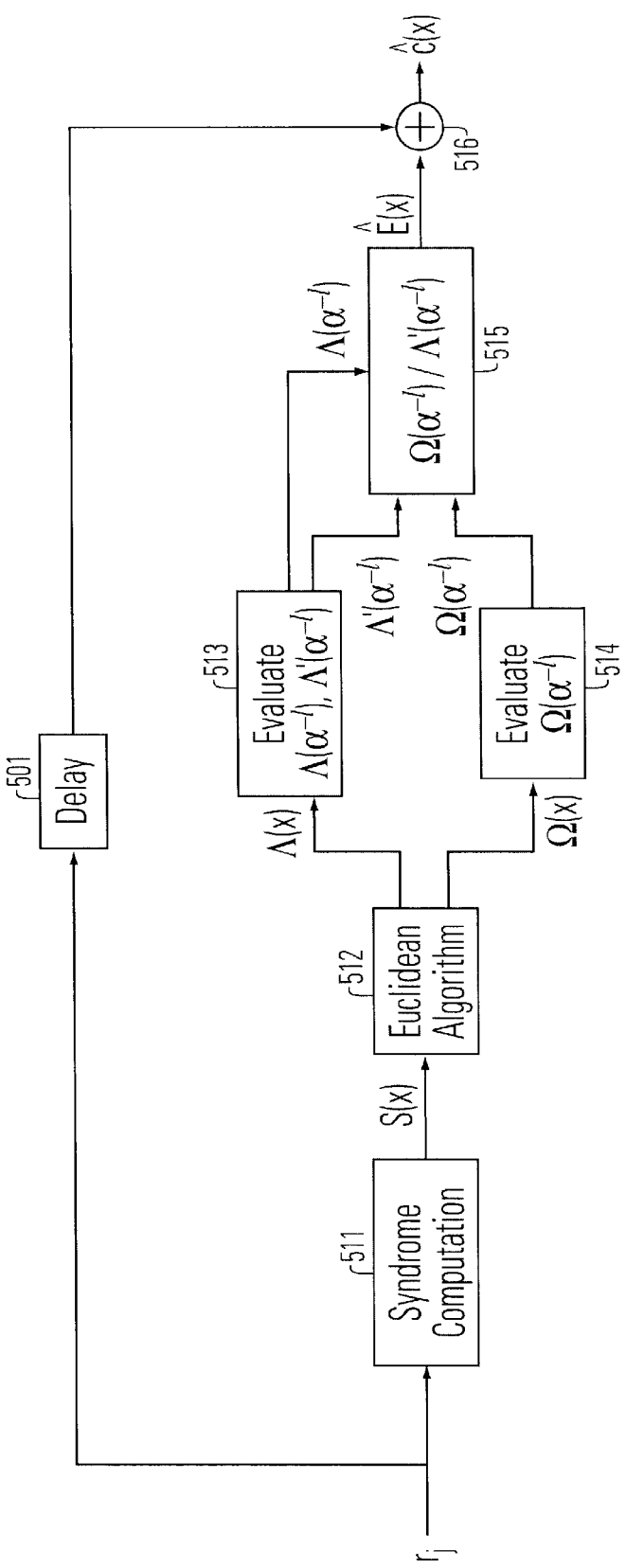
FIGS. 5–6 are block diagrams of a Reed-Solomon decoder and a systolic architecture which embody the principles of the present invention.

FIG. 5 is an overview of a Reed-Solomon decoder applying Euclid's algorithm. Before examining this decoder, it is worth while to review the encoding of a message to create a code word. Let GF($2^m$) be the Galois Field of $2^m$ elements where m is a positive integer. And let $N=2^m-1$ be the length of the (N, K) Reed-Solomon ("RS") code over GF($2^m$) with minimum distance $d=2*t+1$ where $K=N-(d-1)$ or $K=N-2*t$ is the number of m-bit message symbols and t is the error correcting capability of the code. A RS code can be defined in terms of its generator polynomial, $$G(x) = \prod_{i=1}^{2t}(x - \alpha^i),$$

where α is a primitive element in GF($2^m$).
The code word of a systematic code $$C(x) = \sum_{i=0}^{N-1} c_i x^i$$

is obtained as:

$$C(x)=x^{2t}M(x)+D(x),$$

in which M(x) is the message polynomial, D(x) is the residual of the following modulo operation $$D(x)=x^{2t}M(x) \bmod G(x),$$

where mod denotes the modulo operation. The term $x^{2t}M(X)$ effectively pads the message polynomial with zero terms in the lower order positions of the polynomial, where the 2t error correction terms of D(x) appear. This form of code is referred to as a systematic code because the error correction terms are concatenated to the message terms without altering the message terms.

When a code word is transmitted, it is prone to pick up errors as a result of noisy communication channels, such as radio signals or copper telephone lines. A received polynomial R(x) may differ from C(x) because of noise. This code word corruption by noise can be viewed as adding an error polynomial $$E(x) = \sum_{i=0}^{N-1} e_i x^i \text{ to } C(x).$$

That is, $$R(x) = \sum_{i=0}^{N-1} r_i x^i = C(x) + E(x)$$

Thus, decoding is a matter of determining E(x), which involves locating which of the terms $x^i$ contain errors and determining the magnitude of the errors at those locations. A variety of algorithms have been developed to decode RS codes.

Generically, decoding takes place as follows:
1. Compute of the syndrome polynomial $$S(x) = \sum_{i=1}^{2t} s_i x^{i-1},$$

with $$s_i = R(\alpha^i) = \sum_{j=0}^{N-1} r_j \alpha^{ij}.$$

Note that when S(x) is all zero terms, that means that an error free message has been received. (Or, it is remotely possible that a combination of errors has generated another valid code word, other than the one that was sent.) The same result will be obtained for S(x)'=0 if a decoding algorithm is carried out or the algorithm is short cut and the result announced, that E(x)=0.

2. Solve what is known as the "key equation" $\Lambda(x)S(x)=\Omega(x) \bmod x^{2t}$ to obtain the "error location polynomial"

$$\Lambda(x) = \sum_{i=0}^{t} \lambda_i x^i$$

and the "error evaluator polynomial"

$$\Omega(x) = \sum_{i=0}^{t-1} \omega_i x^i.$$

3. Evaluate Λ(x) and Ω(x) to get the error locations and values.
4. Correct the errors by subtracting E(x) from the received codes.

The most difficult and computationally complex of these steps is solving the key equation. It is the core of the decoding process. Application of Euclid's algorithm is one of numerous ways to solve the key equation in this step.

Euclid's algorithm is a recursive process of finding the greatest common divisor among $x^{2t}$ and $S(x)$ to solve for $\Lambda(x)$ and $\Omega(x)$. Its stages are initialization, iteration and termination. The initial conditions for the algorithm are:

$$\Lambda^{(-1)}(x)=0 \ \Lambda^{(0)}(x)=1$$

$$\Omega^{(-1)}(x)=x^{2t} \ \Omega^{(0)}(x)=S(x)$$

At each iteration $^{(k)}$, use the quotient of $Q^{(k)}(x)=\Lambda^{(k-2)}(x) \div \Lambda^{(k-1)}(x)$ to compute the following:

$$\Lambda^{(k)}(x)=\Lambda^{(k-2)}(x)-[Q^{(k)}(x) \otimes \Lambda^{(k-1)}(x)]$$

$$\Omega^{(k)}(x)=\Omega^{(k-2)}(x)-[Q^{(k)}(x) \otimes \Omega^{(k-1)}(x)]$$

Terminate the process when polynomial division has reduced the degree of $\Omega^{(k)}$ to less than t. Again, t is the error correcting capability of the code. When the process terminates, the error location and error evaluator polynomials are $\Lambda(x)=\Lambda^{(k)}(x)$ and $\Omega(x)=\Omega^{(k)}(x)$.

In step 3 of decoding, roots of the error location polynomial $\Lambda(x)$ are found, that is, elements of the field which, when substituted into $\Lambda(x)$, yield $\Lambda(x)=0$. Each root value indicates the position in the received code word of an erroneous symbol. The error value corresponding to that position can be computed from $\Omega(x) \div \Lambda'(x)$ by evaluating this quotient with the root value x, where $\Lambda'(x)$ is the derivative of $\Lambda(x)$. As will be seen below, when the derivative of the polynomial $\Lambda(x)$ is calculated, all of the polynomial terms that are even powers of x drop out. For instance, the derivative of $\alpha x^2$ is $2\alpha x$. Each symbol in a Galois Field $GF(2^m)$ is its own additive inverse. Therefore $2\alpha x=0$, as does $4\alpha=0$, etc. This simplifies calculation of $\Lambda'(x)$, which is needed to calculate the error values corresponding to the root values.

One of the most common ways to find the roots of the error location polynomial over its finite field, referred to as "Chien's search", is to evaluate the polynomial against each element of the field. That is, evaluate $\Lambda(\alpha^{-l})$ by varying the exponent from $l=(N-1)$ to 0. To compute $\Lambda(\alpha^{-l})$, simply substitute $\alpha^{-l}$ into $\Lambda(x)$, which yields $$\Lambda(\alpha^{-l}) = \sum_{j=0}^{t} \lambda_j \alpha^{-lj}.$$

(From the multiplication table FIG. 3, the multiplicative inverses $\alpha^{-l}$ are apparent, as $\alpha^{-l} \otimes \alpha^{l}=1$.) Those skilled in the art will recognize that this summation is similar to the summation required to calculate syndromes and that Horner's rule can be applied to both summations to yield a recursive equation well suited to systolic computation.

Once the error locations are known, the error values can be calculated. These error values are $$e_l=\Omega(\alpha^{-l}) \div \Lambda'(\alpha^{-l}) \text{ when } \Lambda(\alpha^{-l})=0 \text{ and } e_l=0 \text{ otherwise}.$$

The calculation of $\Lambda'(x)$ is simplified by the following observations:

$$\Lambda'(x) = \sum_{odd \ i} \lambda_i x^{i-1},$$

is limited to odd values of i, as mentioned above, because each element is its own additive inverse. Further, $$\Lambda'(x) = \sum_{odd \ i} \lambda_i x^{i-1} = \sum_{i=2j+1} \lambda_{2j+1} x^{2j}.$$

Simplification results after we rewrite $\Lambda(x)$ as $\Lambda(x)=x \cdot \Lambda odd (x^2)+\Lambda even(x^2)$, when we define $$x \cdot \Lambda odd(x^2) = x \cdot \sum_{odd \ i} \lambda_1 x^{i-1} = x \cdot \sum_{i=2j+1} \lambda_{2j+1} x^{2j}$$

and $$\Lambda even(x^2) = \sum_{even \ i} \lambda_1 x^i = \sum_{i=2j} \lambda_{2j} x^{2j}.$$

It is obvious that $\Lambda'(x)=\Lambda odd(x^2)$. Simplification results from separate calculation of $\Lambda odd(x^2)$ and $\Lambda even(x^2)$, which leads simultaneously to $\Lambda'(x)$ and $\Lambda(x)$.

Returning to FIG. 5, the block diagram shows the structure of a decoder embodying the principles of the present invention. The received message polynomial, individual terms denoted $r_j$, is serially input to both a delay buffer 501 and syndrome calculation means 511. The delay buffer 501 holds one or more code words as an error polynomial $\hat{E}(x)$ is calculated for each received code word. After an appropriate delay, the polynomial code word is combined with $\hat{E}(x)$ at Galois Field adder 516 to produce the corrected message $\hat{c}(x)$. In carrying out the present invention, a conventional means for calculation of syndromes can be used. A variation of Berlekamp's Power Sums Tower, Chapter 10 at p. 213 et seq. might be used. The general approach to calculating syndromes is described by Lin & Costello at p. 167–68 and 173–74. A detailed description of a syndrome calculator appears in Alok Sharma, "Methods and Apparatus for Error Correction", U.S. Pat. No. 5,889,793, FIG. 4 & col. 10 line 44 to column 13 line 26 (issued Mar. 30, 1999). A systolic array for syndrome calculation is described in Keiichi Iwamura, Yasunori Dohi & Hideki Imai, "A Design of Reed-Solomon Decoder with Systolic-Array Structure," IEEE Transactions on Computers, Vol. 44, No. 1, pp. 118–122 (January 1995). Alternatively, the specific structure for calculating syndromes described below can be used.

The output of the syndrome computation 511 is a syndrome polynomial $S(x)$, preferably transferred by a parallel output into the Euclid's algorithm logic 512. The output of the Euclid's algorithm logic 512 is two polynomials, the error location polynomial $\Lambda(x)$, which is passed to evaluator. 513 and the error evaluator polynomial $\Omega(x)$, which is passed to evaluator 514. Error calculator 515 receives from evaluator 514 the result of evaluating $\Lambda(\alpha^{-l})$, at least when the result is zero, which identifies an error location in the input polynomial. Error calculator 515 receives from evaluator 513 the value $\Lambda'(\alpha^{-l})$ and receives from evaluator 514 the value $\Omega(\alpha^{-l})$, allowing calculation of error polynomial $\hat{E}(x)$ as indicated. Galois Field adder 516, preferably a modulo-2 adder, combines $\hat{E}(x)$ and $R(x)$ to produce the corrected message $\hat{c}(x)$.

Figure 6:
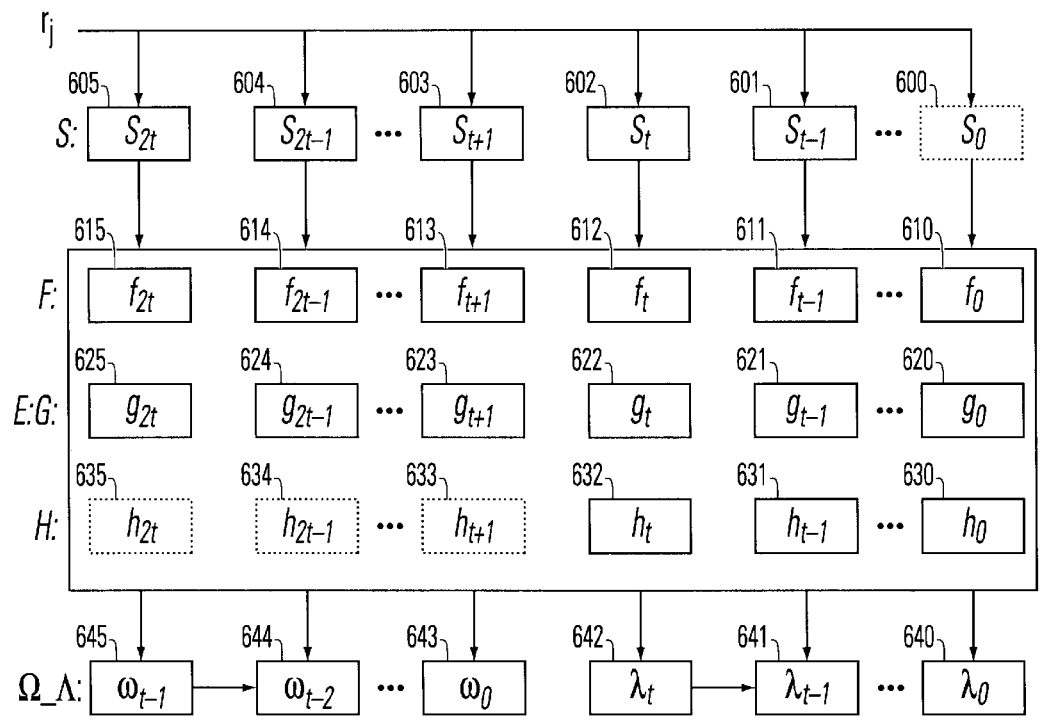

A preferred systolic array structure embodying the principles of the present invention is illustrated in FIG. 6. This block diagram shows three stages of computation. Syndrome calculation takes place in the S array, illustrated by one dummy cell 600 and 2t computation cells identified as 601 to 605. The dummy cell can supply the initialization value 1 to the zeroth cell 620 of the G row of second cells. Alternatively, this value can be associated with the zeroth second cell or otherwise supplied, in which case the S array would consist of only 2t cells. Euclid's algorithm is applied in the E array, comprised of an F row or subsidiary of 2t+1 first cells 610 to 615, a G row of 2t+1 second cells 620 to 625, and an H row of t+1 third cells 630 to 632. Referring to these cells as being in rows is not meant to limit the invention to a particular physical layout of cells, but rather for logical clarity. Similarly, reference to "cells" is not meant to limit the physical placement of circuitry which embodies the indicated logic. To the extent practical, it is preferred, but not necessary, for circuitry used in a cell to be compactly and regularly laid out, as compactness and regularity are ordinarily considered to be advantages of systolic architectures. H. T. Kung, "Why Systolic Architectures?", Computer—Los Alamitos, pp. 37–46 (January 1982). For regularity, dummy third cells 633 to 635 also are identified. These dummy cells can supply default values to second cells 623 to 625. Alternatively, the default values can be associated with the second cells or otherwise supplied. Error location and value evaluation are carried out in the error evaluator array $\Omega\_\Lambda$, comprised of 2t+1 cells 640 to 645 which are subdivided into three subarrays $\Lambda$even, $\Lambda$odd and $\Omega$, which are further described below. As in FIG. 5, the terms $r_j$ of the received signal are input. FIG. 6 depicts distribution of each term $r_j$ in parallel to one dummy cell 600 and 2t computation cells 601 to 605. The syndromes and the initial value 1 are illustrated as passing in parallel from cells 600 to 605 to the E array, where they pass in particular, to the G row of second cells 620 to 625. The error location and evaluator polynomials accumulate in the G row of second cells. Those polynomials pass in parallel from G row cells 620 to 625 to the $\Lambda$even, $\Lambda$odd and $\Omega$ subarray cells 640 to 645 of the error evaluator array. Again, the row structure in this block diagram is not intended to limit the physical layout of the error evaluator array $\Omega\_\Lambda$.

Figure 7:
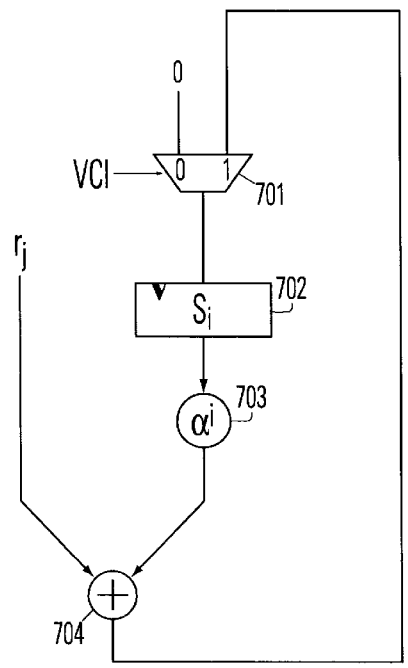
FIG. 7 is a logic diagram for a syndrome calculation cell which embodies the principles of the present invention.

FIG. 7 depicts the logic of a typical syndrome calculation cell, such as cell 601 through 605. It is to evaluate the syndrome $$S_i = \sum_{j=0}^{N-1} r_j \alpha^{ij}.$$

Using Horner's rule, we have $s_i = (\ldots ((r_{N-1})\alpha^i + r_{N-2})\alpha^i + \ldots)\alpha^i + r_0$. Syndrome register $s_i$ is initialized to be "0" before the syndrome calculate signal VCI enabled. The logic performs the computation $s_i \Leftarrow s_i \alpha^i + r_j$. The computation is completed when the signal VCI is no longer enabled. Then syndrome output signal ToG is enabled for one clock period and register $s_i$ is stored into register $g_i$ in the G sub-array, i.e., $g_i \Leftarrow s_i$. Referring to FIG. 7, mux 701 is responsive to signal VCI. When signal VCI is in a first state, the mux selects the value "0" to load into register 702. When the signal VCI is in the opposite state, the mux selects the result of modulo-2 adder 704 to load into register 702. Register 702 is coupled to constant multiplier 703. The exponent "i" of the constant corresponds to the ordinal position of syndrome term $s_i$ which is being calculated. For instance, for calculation of $s_2$ in a cell between 600 and 601, the constant is $\alpha^2$. The modulo-2 adder receives input signals $r_j$ in sequence and combines them with the output of constant multiplier 703. This sum is then supplied to mux 701.

Figure 8:
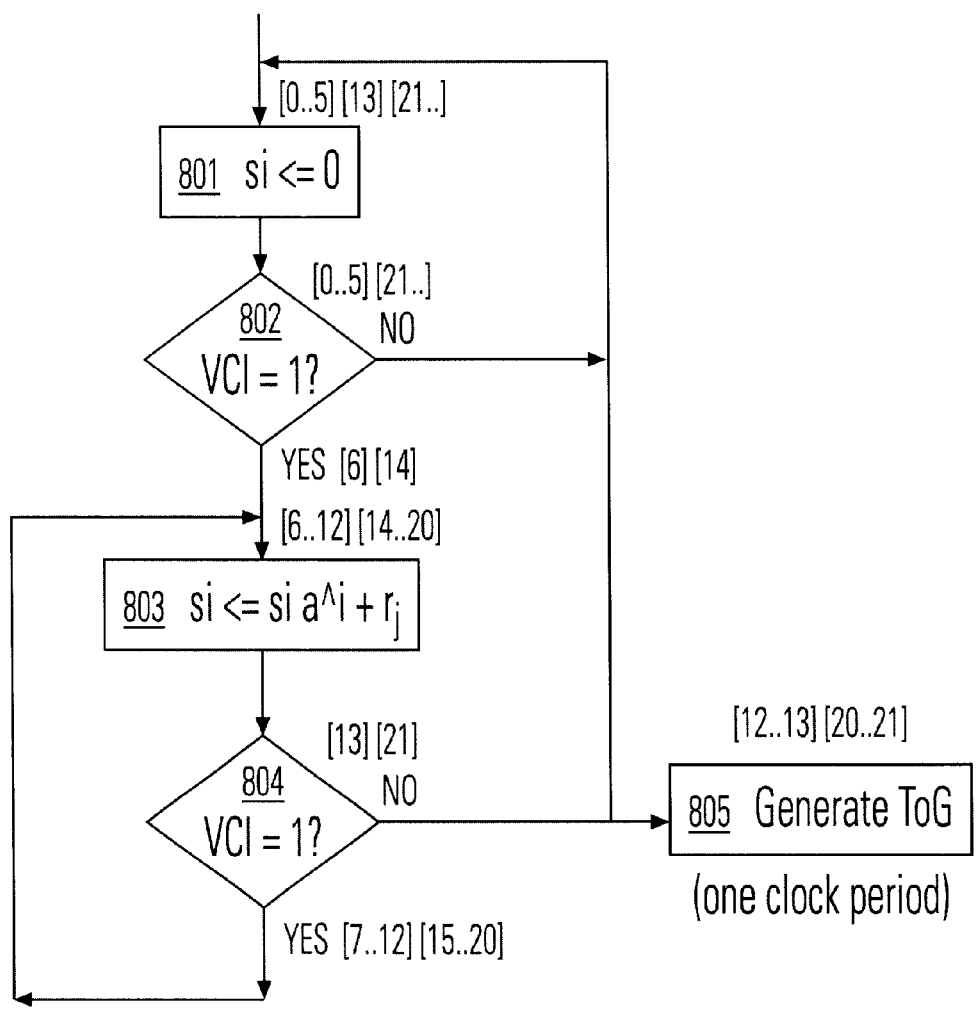
FIG. 8 is a control flow chart for syndrome calculation.

FIG. 8 depicts one control logic for syndrome computation. Throughout this figure, number sequences appear in square brackets near the logical steps. For instance, near block 801, the numbers [0 . . . 5] [3] [21 . . . ] appear. These bracketed numbers correspond to the time line numbers along the top of FIG. 32. For instance, the value "0" is assigned to each of the registers $s_{1\ldots4}$ while control signal factored VCI is low at times 0 through 5. Note in FIG. 32 that control signal VCI does not go high until slightly after the leading-edge of the clock signal at time 5. In FIG. 8, the process begins with the assignment of the value "0" to registers $s_i$ in block 801. Control flows to block 802 which determines whether control signal VCI is true. If the control signal is not yet true, control flows back to assignment block 801. If the control signal is true, control passes to the assignment block 803, where the accumulated contents of register 702 are multiplied by the constant in 703 and added to the received polynomial term by modulo-2 adder 704. Still referring to assignment block 803, the sum generated by 704 is loaded back into register 702. Control flows to block 804, which determines whether control signal VCI is true? If the signal is still true, the process continues to iterate, with control passing back to block 803. If the signal is low, there are two consequences. A signal is generated in block 805 which transfers the syndromes to the Euclid algorithm array, as described above. Control flows to block 801 for calculation of additional syndromes for a new code word.

FIGS. 9–12 illustrate logic of and control signals for the first, second and third cells. Note that this logic must be modified somewhat for the zero order cells 610, 620 and 630 as the logic depicted requires input from the next lower order cell and the zeroth cells are already the lowest order cells. First, second and third cells populate the three sub-arrays F, G, and H of the E array. The E array implements Euclid's algorithm to compute the error location and error evaluator polynomials. The F sub-array, consisting of cells $f_{2t}$, $f_{2t-1}$, . . . , $f_0$, stores and computes the coefficients of $\Omega^{(k-2)}(x)$ and $\Lambda^{(k-2)}(x)$, $\Omega^{(k-2)}(x)$ being stored in the left or higher order cells and $\Lambda^{(k-2)}(x)$ being stored in the right or lower order cells. The G sub-array, consisting of cells $g_{2t}$, $g_{2t-1}$, . . . , $g_0$, stores and computes the coefficients of $\Omega^{(k-1)}(x)$ and $\Lambda^{(k-1)}(x)$, with $\Omega^{(k-1)}(x)$ being stored in the left part and $\Lambda^{(k-1)}(x)$ in the right part. The H sub-array, consisting of cells $h_{2t}, h_{2t-1}, \ldots, h_0$, stores and computes the coefficients of the product polynomial $Q^{(k)}(x)\Lambda^{(k-1)}(x)$. Note that, because the polynomial computation terminates when the degree of $\Omega^{(k-1)}(x)$ is less than t, the degree of $\Lambda^{(k)}(x)$ can not be more than t. Therefore, cells $h_{2t}, h_{2t-1}, \ldots, h_{t+1}$ are virtual dummy cells, which have a default value of zero for convenience. Referring back to FIG. 6, the cells of the sub-arrays are loaded with polynomial terms such that the exponent or order of the polynomial term descends from left to right along the sub-array. With this arrangement, first cell $f_{2t}$ and second cell $g_{2t}$, which are the leftmost cells of the F sub-array and G sub-array, will always store the leading coefficients of the $\Omega^{(k-2)}(x)$ and $\Omega^{(k-1)}(x)$, respectively. When the algorithm stops, the contents of the registers in the G sub-array are passed in parallel into registers in the $\Omega\_\Lambda$ array.

In addition to computation cells, to perform Euclid's algorithm, control signals are required. As further explained below, the control signal ShiftF is used to perform the operation of the division and to compute $\Lambda^{(k)}(x)$. The control signal ShiftG is used to shift the polynomial left when the leading coefficient of $\Omega^{(k-1)}(x)$ is zero, i.e. register $g_{2t}$=0. The control signal Update is used to initialize the next iteration when the division is completed. Two more indication signals are needed fPI$_i$ and gPI$_i$. The signal fPI$_i$ is used to indicate that the cell $f_i$ is for $\Omega^{(k-2)}(x)$ if it is high and is for $\Lambda^{(k-2)}(x)$ if it is low. The signal $gPI_i$ is used to indicate that the cell $g_i$ is for $\Omega^{(k-1)}(x)$ if it is high and is for $\Lambda^{(k-1)}(x)$ if it is low. These signals are also meant to correspond to the degree of $\Omega^{(k-1)}(x)$ and $\Omega^{(k-2)}(x)$.

Figure 9:
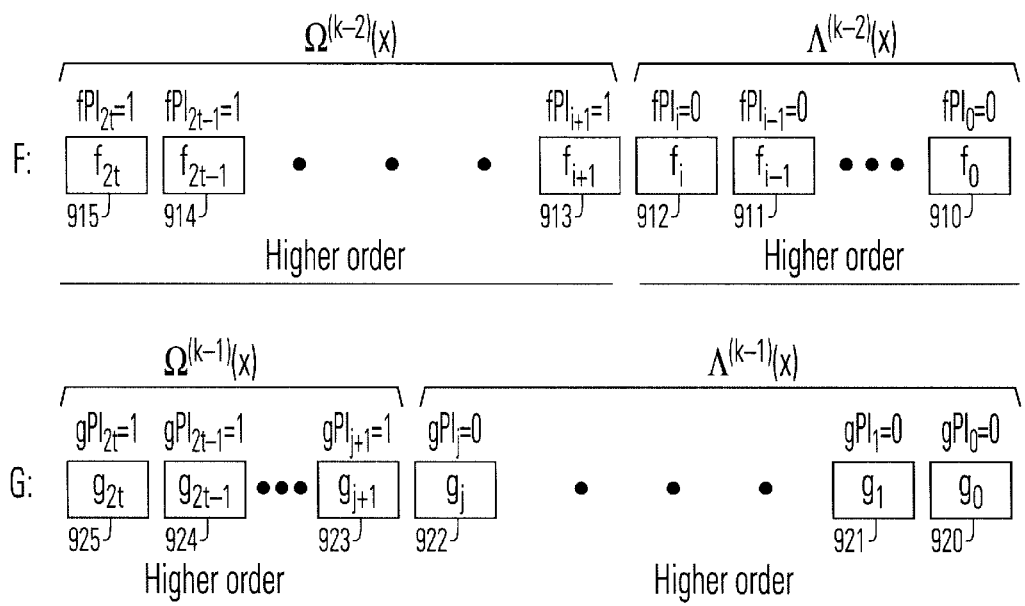
FIG. 9 is an array partitioning diagram for the arrays of first and second cells used to apply Euclid's algorithm.

FIG. 9 illustrates how signals $fPI_i$ and $gPI_i$ logically partition the F and G arrays.

Associated with each first cell $f_i$ 910–915 is a control signal $fPI_i$. When $fPI_i$ has the value "0", it indicates that cell $f_i$ contains a term of the polynomial $\Lambda^{(k-2)}(x)$; when this control signal has the value "1" the cell contains a term of the dividend polynomial $\Omega^{(k-2)}(x)$. Similarly, when $gPI_i$ has the value "0", it indicates that cell $g_i$ contains a term of the polynomial $\Lambda^{(k-1)}(x)$; when this control signal has the value "1" the cell contains a term of the divisor polynomial $\Omega^{(k-1)}(x)$. To repartition the F array, for instance, the control signal associated with a first cell f, in this illustration first cell $f_{i+1}$ 913, is changed from "1" to "0". This change in control signal converts cell 913 from being the lowest order term of $\Omega^{(k-2)}(x)$ to being the highest order term of $\Lambda^{(k-2)}(x)$. The ShiftG operation of shifting the $\Omega^{(k-1)}(x)$ polynomial in the second cells to the left is accompanied by repartitioning the G array to reflect the shift. The order of magnitude of the polynomial $f(x)$ stored in the higher order first cells $f_i$ corresponds to the sum of the digits of the control signal $fPI_i$, that is order $f(x)=\Sigma_{i=0}^{2t} fPI_i$.

Figure 12:
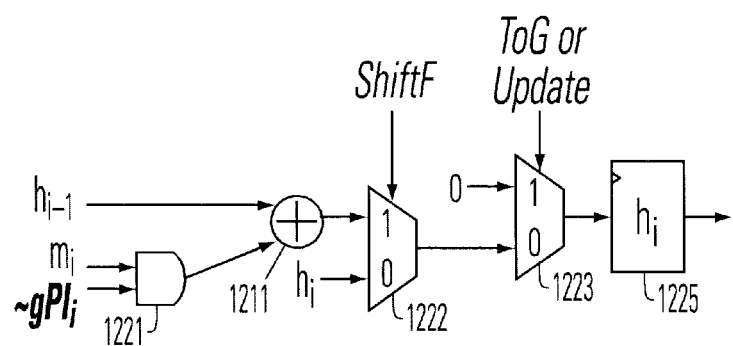

FIGS. 10–12 are intended to illustrate some of the following equations. Initially, when ToG is enabled, set:

F: 100 . . . 00,

G: $s_{2t}s_{2t-1}$ . . . $s_1s_0$(note that $s_0$ is 1),

H: 00 . . . 00, fPI: 11 . . . 10, gPI: 11 . . . 10.

At each iteration, we have the corresponding operations for the following control signals for i varying from 2t to 0. For control signal ShiftF:

$f_i <= f_{i-1} \& fPI_{i-1} + qg_{i-1} \& gPI_{i-1} + f_i \& \sim fPIi$ $g_i <= g_i$ $h_i <= h_{i-1} + qg_i \& \sim gPIi$ $fPI_i <= fPI_{i-1}$ $gPI_i <= gPI_i$ For control signal Update:

$f_i <= g_i$ $g_i <= f_i + h_i \& \sim fPI_i$ $h_i <= 0$ $fPI_i <= gPI_i$ $gPI_i <= fPI_i$ And, for control signal ShiftG:

$f_i <= f_i$ $g_i <= g_{i-1} \& gPI_{i-1} + g_i \& \sim gPI_i$ $h_i <= h_i$ $fPI_i <= fPI_i$ $gPI_i <= gPI_{i-1}$ As an overview, for the ShiftF operation, in the equation to assign a new value to or to "update" $f_i$, the term ($f_{i-1}$ & $fPI_{i-1} + qg_{i-1}$ & $gPI_{i-1}$) is a remainder, and the term ($f_i$ & $\sim fPI_i$) is to hold $\Lambda^{(k-2)}(x)$ unchanged, when $f_i$ is a term of the polynomial $\Lambda^{(k-2)}(x)$. The update $h_i$, the equation above is equivalent to $h(x)<=h(x)x+q_i\Lambda^{(k-1)}(x)$. In this equivalent update equation, the term $h(x)x$ shifts a polynomial term one position left, that is, $h_i<=h_{i-1}$. One of skill in the art will recognize the H array is being used to apply Horner's rule to calculation of $Q^{(i)}\Lambda^{(i-1)}(x)$. When a cell in the G sub-array contains a term of the polynomial $\Lambda^{(k-1)}(x)$; the control signal $gPI_i$ is low, hence the term ($g_i$&$\sim gPI_i$). The G sub-array does not change during the ShiftF operation, because it is the divisor. At each iteration of division, the degree of $\Omega^{(k-2)}(x)$ decreases by one, so the values of fPI shifts left by one cell, which changes the partitioning of the F array. The control signal ShiftF remains true and iterative division continues until the degree of $\Omega^{(k-2)}(x)$ is less than the degree of $\Omega^{(k-1)}(x)$.

In the ShiftG operation, we need only shift out those leading zero coefficients of $\Omega^{(k-1)}(x)$, as the term ($g_{i-1}$& $gPI_{i-1}$) implies and otherwise keep the polynomial terms unchanged. Each time we shift out one leading zero coefficient of $\Omega^{(k-1)}(x)$, the degree of $\Omega^{(k-1)}(x)$ is decreased by one. The operation $gPI_i<=gPI_{i-1}$ repartitions the G array, to reflect the decreased degree of $\Omega^{(k-1)}(x)$. During the operation of ShiftG, the signals ShiftF and Update are disabled.

In the Update operation, the division of $\Omega^{(k-2)}(x)$ by $\Omega^{(k-1)}(x)$ and the computation of the product polynomial $Q^{(k)}(x)\Lambda^{(k-1)}(x)$ are completed. Intermediate results from the H array for the term $Q^{(k)}(x) \Lambda^{(k-1)}(x)$ are combined with stored results for $\Lambda^{(k-2)}(x)$. For cells $f_i$, $g_i$, and $h_i$, increment k for the next iteration. The operation for $f_i$ loads the value from $g_i$. The operation for $g_i$ loads $f_i$ into $g_i$ for higher order second cells and calculates $\Lambda^{(k)}(x)<=\Lambda^{(k-2)}(x)-Q^{(k)}(x) \Lambda^{(k-1)}(x)$ for lower order second cells. The partitioning of the F and G arrays remains unchanged.

In the ToEval operation, the content of register $g_i$ is copied into register $\lambda_i$ and register $\omega_i$: $\lambda_i<=s_i$ for i=0 to t and $\omega_i<=s_{i+t+1}$ for i=0 to t–1. With these equations and explanations in mind, FIGS. 10–12 can be better understood.

In FIG. 10, Galois Field multiplier 1001 is part of first cell $f_i$. Its inputs are a quotient of the highest order term of $\Omega^{(k-2)}(x)$ in first $cell_{2t}$ 615 divided by highest order term of $\Omega^{(k-1)}(x)$ in second $cell_{2t}$ 625, to be multiplied by the value from second cell $g_i$. (By reference to FIG. 15, it can be seen that the product $m_{i-1}$ in 1512, for instance, is supplied to both first $cell_i$ 1511 and third $cell_{i-1}$ 1532.) The second sequence of FIG. 10, 1002–1005, illustrates the processing of certain control signals associated with cell $f_i$. The control signal F polynomial indicator ("fPI") may be embodied in a register physically proximate to other logic elements of a first cell or may be maintained physically apart from any of the first cells and distributed as a control signal. Part of the logic controlling the fPI signal is illustrated. Block 1005 indicates one bit of storage for the control signal's current value. A value is loaded into this storage from mux 1004, which is responsive to the signal ToG. When signal ToG is in a first state, the mux initializes the storage with the value 1. When the signal is in the opposite state, mux 1004 passes to storage 1005 the result from mux 1003. Mux 1003, is responsive to control signal ShiftF. When signal ShiftF is in a first state, the mux effectively performs a bit shift operation, assigning the next lower order control signal F polynomial indicator $fPI_{i-1}$ to $fPI_i$. When the signal is in an opposite state, mux 1003 passes to mux 1004 the result from mux 1002. Mux 1002 is responsive to control signal Update. When control signal Update is in a first state, the mux effectively updates the control signal for the first cell with the corresponding control signal for the second cell, $gPI_i$. When the signal is in the opposite state, the mux effectively loops the value of the control signal back to itself.

The principal logic in an F row first cell is in the part of FIG. 10 numbered 1011 through 1035. AND gate 1011 has as inputs the polynomial term from the next lower order first cell, $f_{i-1}$ and the control signal associated with that cell, $fPI_{i-1}$. AND gate 1021 has as inputs a product $m_{i-1}$ and the control signal $gPI_{i-1}$. The third AND gate 1031 has as inputs the unmodified polynomial term in the current cell, $f_i$ and the inverted control signal associated with the current cell, $\sim fPI_i$. The results of AND gates 1011 and 1021 are combined by modulo-2 adder 1012. The result of adder 1012 is combined with result of AND gate 1031 by adder 1022. Mux 1032 is responsive to control signal ShiftF. When the control signal is in a first state, the result from adder 1022 is output. Otherwise, the mux passes the current value of the current cell as its result, to mux 1033. Mux 1033 is responsive to control signal Update. When the control signal is in a first state, the mux permits the polynomial term $f_i$ in the current first cell to be updated with the polynomial term $g_i$ from the corresponding second cell. In this state, mux 1033 outputs $g_i$ to mux 1034. When control signal Update is in an opposite state, mux 1033 outputs the result from mux 1032. Mux 1034 is responsive to the control signal ToG. When this control signal is in a first state, the value "0" initializes the first cell $f_i$, except that the highest order first cell$_{2t}$ is initialized with value "1". Otherwise, mux 1034 passes the result of mux 1033 to register 1035.

The first sequence of FIG. 11, 1102–1105, illustrates the processing of certain control signals associated with the cell $g_i$. The control signal call for G polynomial indicator ("gPI") may be embodied in register physically proximate to the other logic elements of the second cell or may be maintained physically apart from any of the second cells and distributed as a control signal. Part of the logic controlling the gPI signal is illustrated. Block 1105 indicates one bit of storage for the control signal's current value. A value is loaded into this storage from mux 1104, which is responsive to the signal ToG. When signal ToG is in a first state, the mux initializes the storage with the value 1. When the signal is in the opposite state, mux 1104 passes to storage 1104 the result from mux 1103. Mux 1103 is responsive to control signal ShiftG. When signal ShiftG is in a first state, the mux effectively performs a bit shift operation, assigning $gPI_i \Leftarrow gPI_{i-1}$. When the signal is in an opposite state, mux 1103 passes to mux 1104 the result from mux 1102. Mux 1102 is responsive to the control signal Update. When the control signal Update is in a first state, the mux effectively updates the control signal for the second cell with the corresponding control signal from the first cell, $fPI_i$. When the signal is in the opposite state, the mux effectively loops the value of control signal back to itself.

The main logic of a second cell appears in the part of FIG. 11 numbered 1111 through 1135. AND gate 1111 has as inputs the polynomial term from the next lower order second cell, $g_{i-1}$ and the control signal associated with that cell, $gPI_{i-1}$. AND gate 1121 has as inputs the current value of the second cell $g_i$ and the inverted control signal associated with that cell, $\sim gPI_i$. The inputs to adder 1112 are the results of AND gates 1111 and 1121. AND gate 1131 has as inputs the polynomial term from the corresponding third cell, $h_i$ and the inverted control signal associated with the corresponding first cell, $\sim fPI_i$. Adder 1122 has as inputs the current value of the corresponding first cell, $f_i$ and the result of AND gate 1131. Mux 1132 is responsive to the control signal Update. When the control signal is in the first state, the result from adder 1122 is output. Otherwise, the mux passes the current value of the current cell as its result to mux 1133. Mux 1133 is responsive to the control signal ShiftG. When the control signal is in the first state, then the mux outputs the result of adder 1112. Otherwise, mux 1133 outputs to mux 1134 the result from mux 1132. Mux 1134 is responsive to the signal ToG. When this control signal is in a first state, the value of a syndrome initializes the second cell $g_i$, except that the lowest order first cell is initialized with value "1". Otherwise, mux 1134 passes the result of mux 1133 to register 1135.

FIG. 12 depicts the logic of a third cell. AND gate 1221 has as.inputs the product $m_i$ and the inverted control signal associated with the corresponding second cell, $\sim gPI_i$. The result of this AND gate is combined in adder 1211 with the polynomial term from the next lower order third cell, $h_{i-1}$. Mux 1222 is responsive to the control signal ShiftF. When the control signal is in the first state, the result from adder 1211 is output to mux 1223. Otherwise, the mux passes the current value of the current cell as its result to mux 1223. Mux 1223 is responsive to a logical OR of the control signals ToG or Update. When either of these signals is true, the mux outputs the value "0" to initialize the current third cell 1225. Otherwise, this mux outputs the result of mux 1222.

Figure 13:
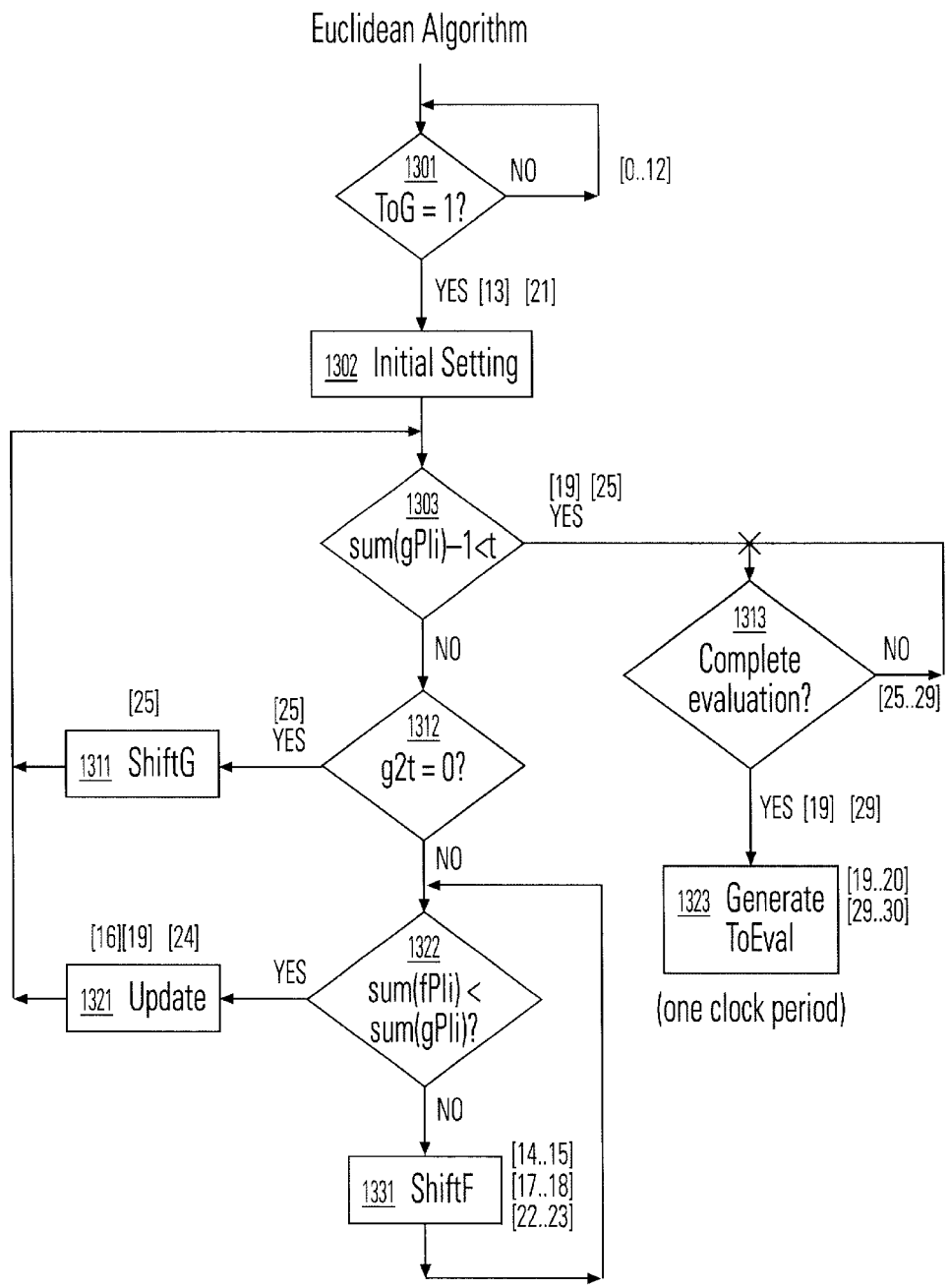
FIG. 13 is a control flow chart to apply Euclid's algorithm.

FIG. 13 depicts one control logic for Euclid's algorithm. As with FIG. 8, throughout this figure number sequences appear in square brackets near the logical steps. These bracketed numbers correspond to the time line numbers along the top of FIG. 32. In FIG. 13, the process begins in block 1301 with a test of the control signal ToG. If the control signal is false, the process waits. When the signal is true, control passes to block 1302. This block represents initialization of cells in the all three subarrays of the E array. Control next passes to the control branch 1303. When the order of the polynomial in the left most second cells is less than t, iteration terminates. This condition is tested by summing the number of polynomial indicator flags set for the second cells, subtracting 1, and comparing the result to t. When iteration proceeds, control passes to block 1312, where the process tests the value of the highest order term of the divisor, in second cell $g_{2t}$. If this term is a zero, the divisor polynomial needs to be shifted left. Control passes to block 1311 and control signal ShiftG is issued. Control loops back to block 1303. Focusing again on the control branch 1312, when the highest order term of the divisor is not zero, control passes to block 1322. The test at block 1322 is to determine whether the dividend polynomial has a lower order than the divisor polynomial. If so, control passes to block 1321 and control signal Update is issued. Then, control loops back to block 1303. In block 1322, if the dividend polynomial has an order greater than or equal to the order of the divisor polynomial, division proceeds. Control passes to block 1331 and control signal ShiftF is issued. After the division is accomplished, control loops back to block 1322. Returning to the control branch 1303, when iteration terminates, control passes to 1313. The process determines whether evaluations are complete. If not, evaluation continues without further iterative division. When the evaluations are complete, control passes to 1323 and control signal ToEval is issued. This signal causes the results of Euclid's algorithm to be passed to the error evaluation stage and the Euclid's algorithm process is ready for the next code word.

Figure 14:
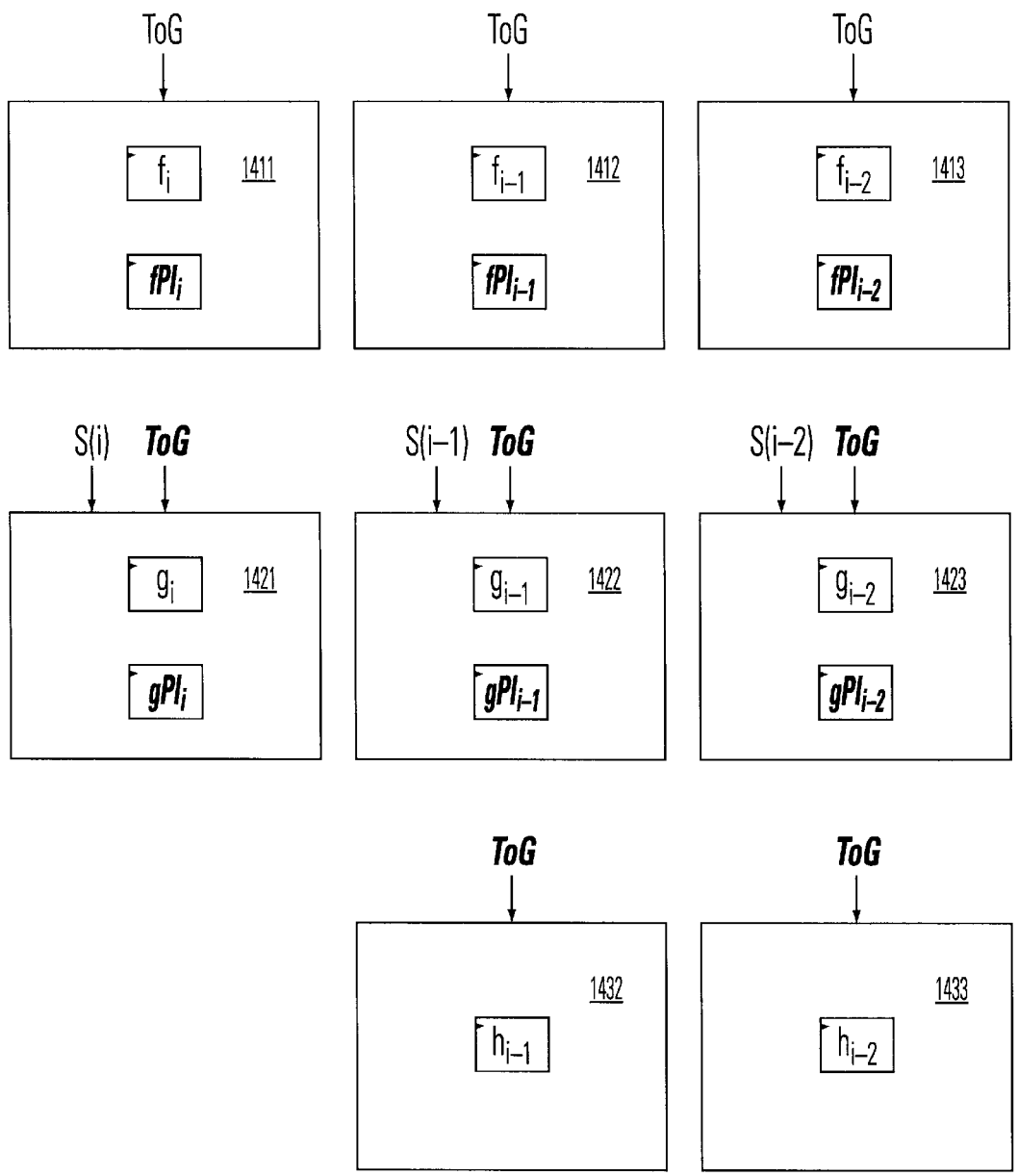
FIGS. 14–18 are data flow block diagrams of how the Euclid's algorithm architecture responds control signals ToG, ShiftF, Update, ShiftG and ToEval, respectively.

FIG. 14 depicts the response of the Euclid's algorithm array to the control signal ToG. In this and following figure, the dummy third cells are not depicted by the dotted line box. Nonetheless, the prior discussion of dummy cells still applies. The first cells are numbered 1411 through 1423. Associated with first each cell is a polynomial term value such as $f_i$ and a control signal such as $fPI_i$. The first cells are initialized in accordance with the equations above. The second cells are numbered 1421 through 1423. Like the first cells, each second cell is associated with polynomial term value and a control signal. Responsive to the control signal ToG, syndrome values are loaded from syndrome calculator cells into corresponding second cells, with the caveat that the value 1 is loaded into the lowest order second cell, $g_0$. The third cells are numbered 1432 and 1433. There are fewer third cells than there are first or second cells. The third cells are initialized to zero, in accordance with the equations above.

Figure 15:
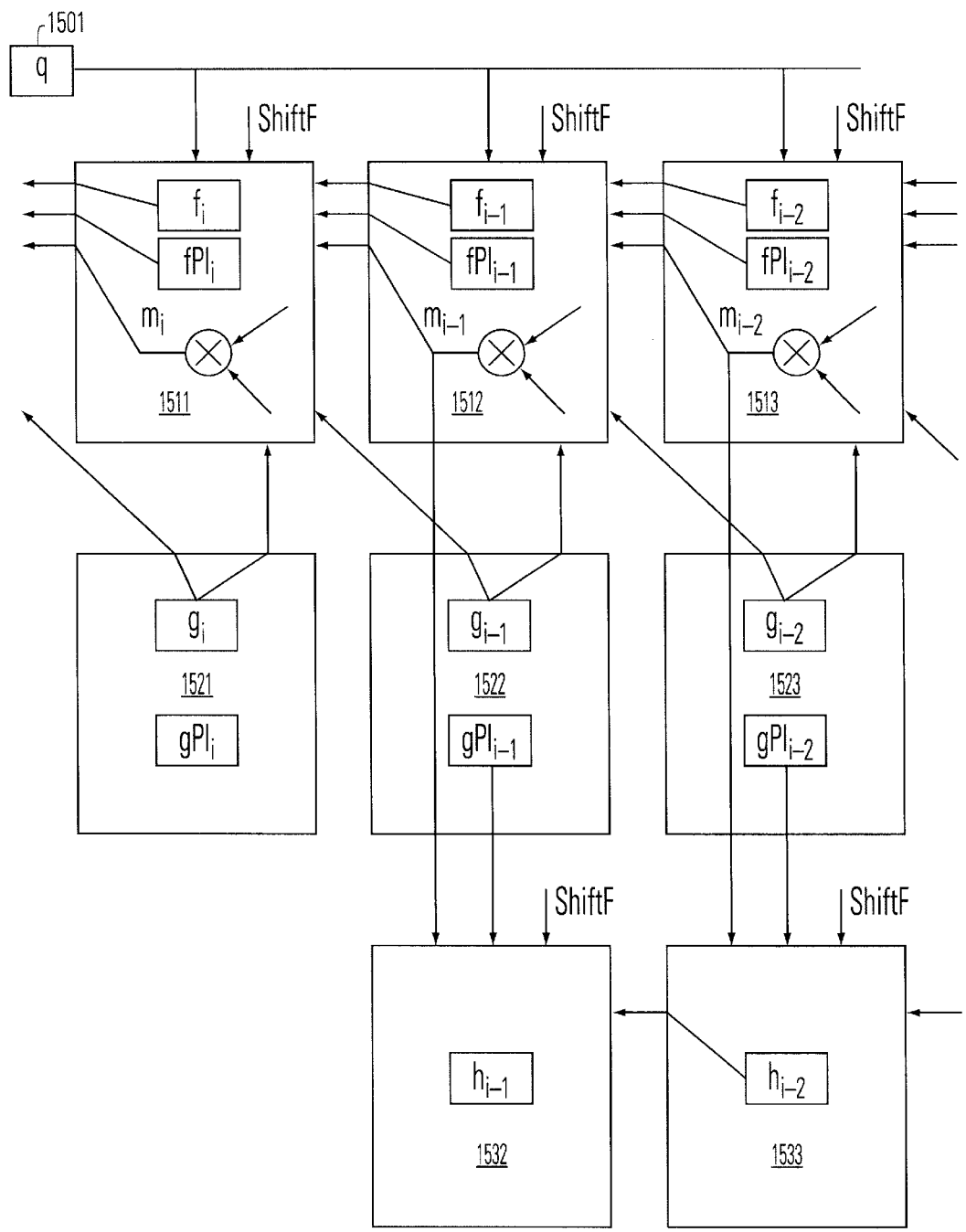

FIG. 15 depicts the flow of data within the Euclid's algorithm array in response to control signal ShiftF. The first cells are numbered 1511–1513. The second cells are numbered 1521–1523. The third cells are numbered 1532 and 1533. A Galois Field divider is represented in this figure by 1501, labeled "q". Only one shared divider is needed to support the entire E array. This design feature holds regardless of the number of elements in $GF(2^m)$. The Galois Field divider operates on the highest order terms of the dividend in first cell $f_{2t}$ and the divisor in second cell $g_{2t}$, which do not appear in this figure. The quotient from this divider is provided to the first cells 1511–1513. The data flow through first cell 1511 reflects the equations set forth above. A typical first cell $f_{i-1}$ processes data associated with the next lower order first cell, $f_{i-2}$ 1513, from the corresponding and next lower order second cells, $g_{i-1}$ 1522 and $g_{i-2}$ 1523 and from the divider 1501. This typical cell outputs data to the next higher order first cell, $f_i$ 1511 and to the corresponding third cell, $h_{i-1}$ 1532. The economy of this design is apparent in the sharing of the result from the multiplier ⊗ in first cell $f_{i-1}$ 1512 with both first cell $f_i$ 1511 and third cell $h_{i-1}$ 1532. In this design, only a single multiplier is needed for each first cell; no multipliers are need in second or third cells. For cell $f_0$, a default value is supplied because there is no lower order cell. The data flow through second cell 1522 likewise represents equations above. No data flows into a second cell 1521–1523 in response to the control signal ShiftF. The data values associated with a typical second cell $g_{i-1}$ 1522 are passed to the corresponding and next higher order first cells, $f_i$ 1511 and $f_{i-1}$ 1512, and to the like ordered third cell $h_{i-1}$ 1532. A typical third cell, $h_{i-1}$ 1532 responds to a ShiftF control signal by processing data in from the divider 1501, like order first cell, $f_{i-1}$ 1512, like order second cell, $g_{i-1}$ 1522 and the next lower order third cell, $h_{i-2}$ 1533. This typical third cell passes data to the next higher order third cell, $h_i$ which does not appear in this figure. For cell $h_0$, a default value is supplied because there is no lower order cell.

Figure 16:
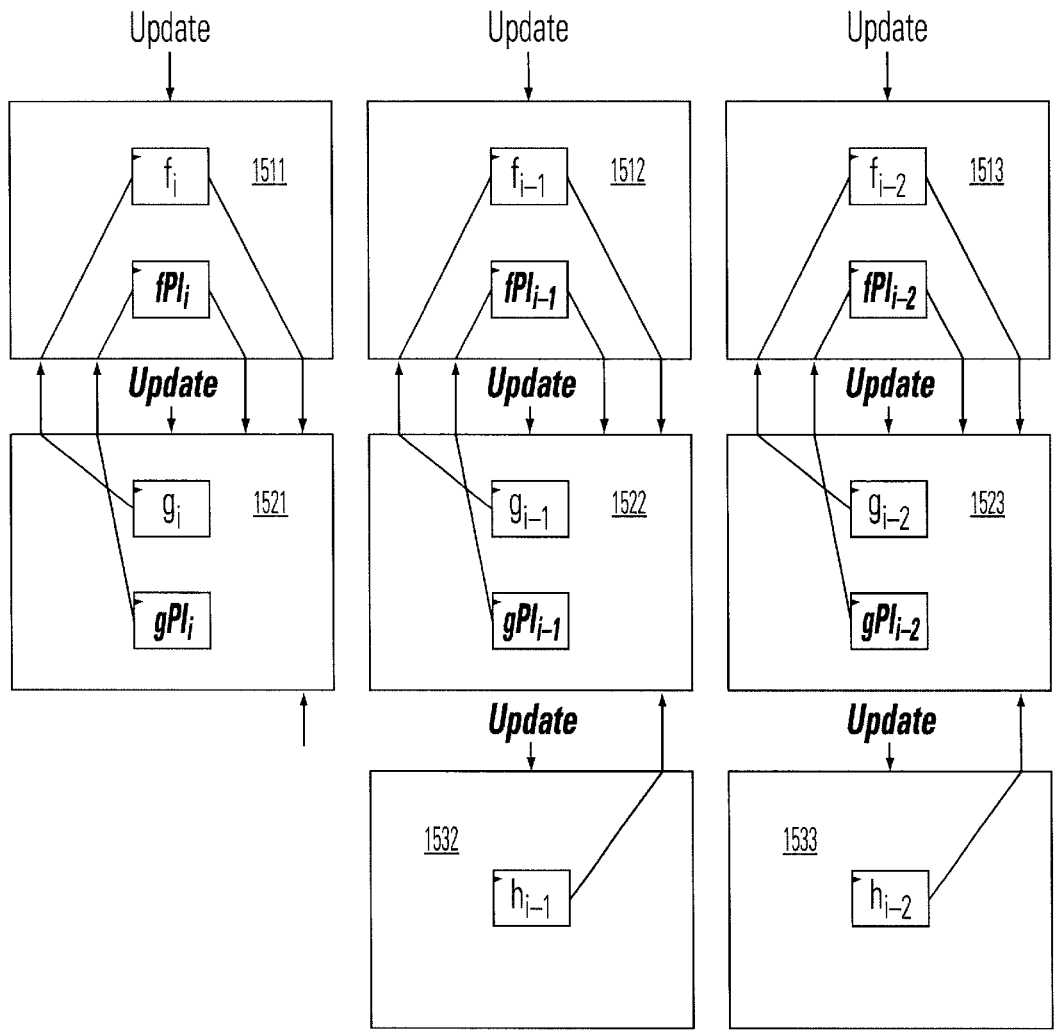

FIG. 16 depicts the flow of data within the Euclid's algorithm array in response to control signal Update. The cell numbering is as in FIG. 15. In response to an Update control signal, a typical first cell 1511 receives data values from its corresponding second cell 1521 and except those values as transferred. The data values associated with the typical first cell are passed to the corresponding second cell. The typical second cell 1522 receives data from the corresponding first cell 1512 and from the corresponding third cell 1532. Second cells $g_{t+1 \ldots 2t}$ are provided default values from dummy third cells or otherwise.

Figure 17:
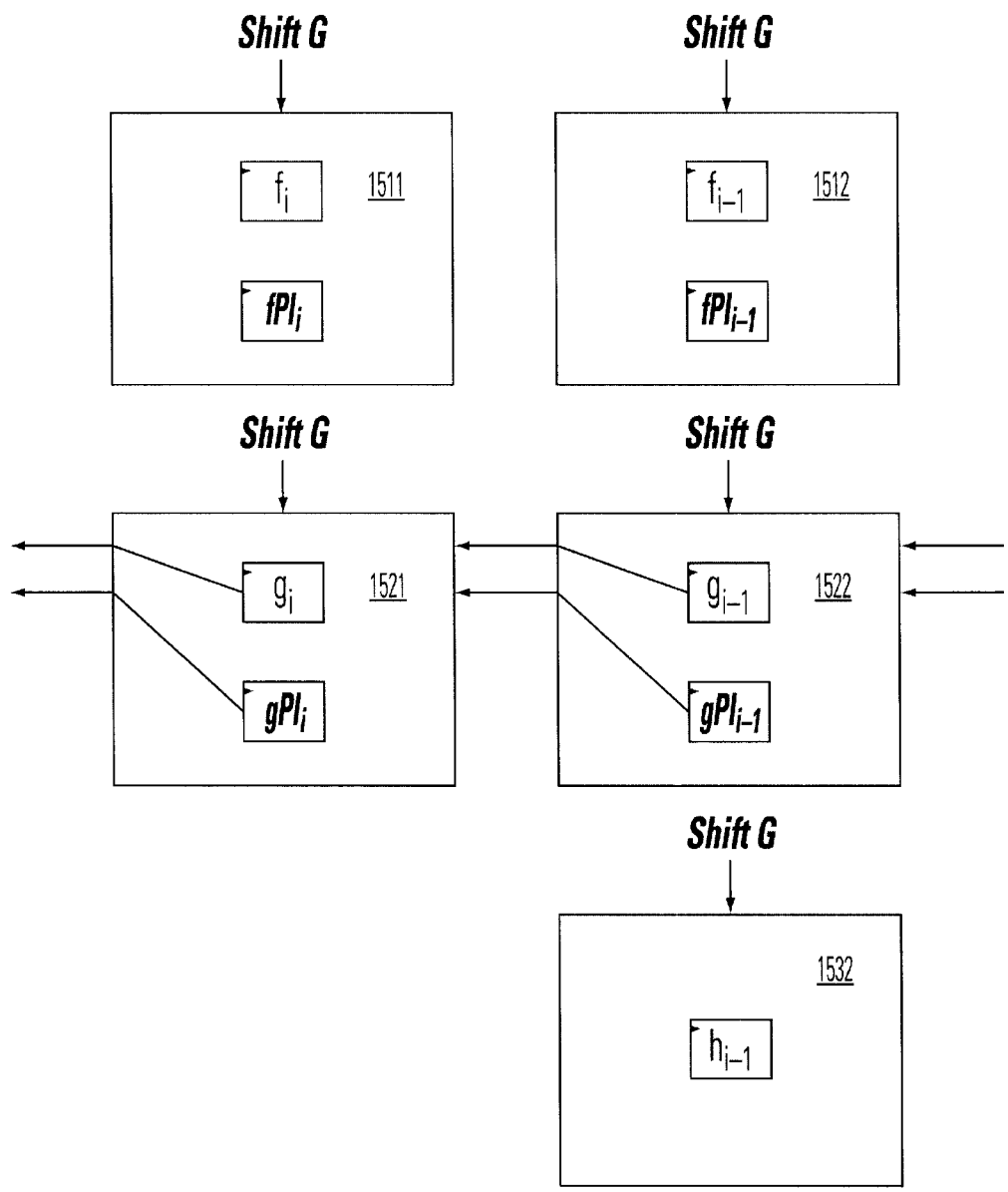

FIG. 17 depicts the flow of data within the Euclid's algorithm array in response to control signal ShiftG. There is no data flow in or out of either the first or third cells in response to this control signal. The only data flow is a left shift of data among second cells, as from cell 1522 to cell 1521.

Figure 18:
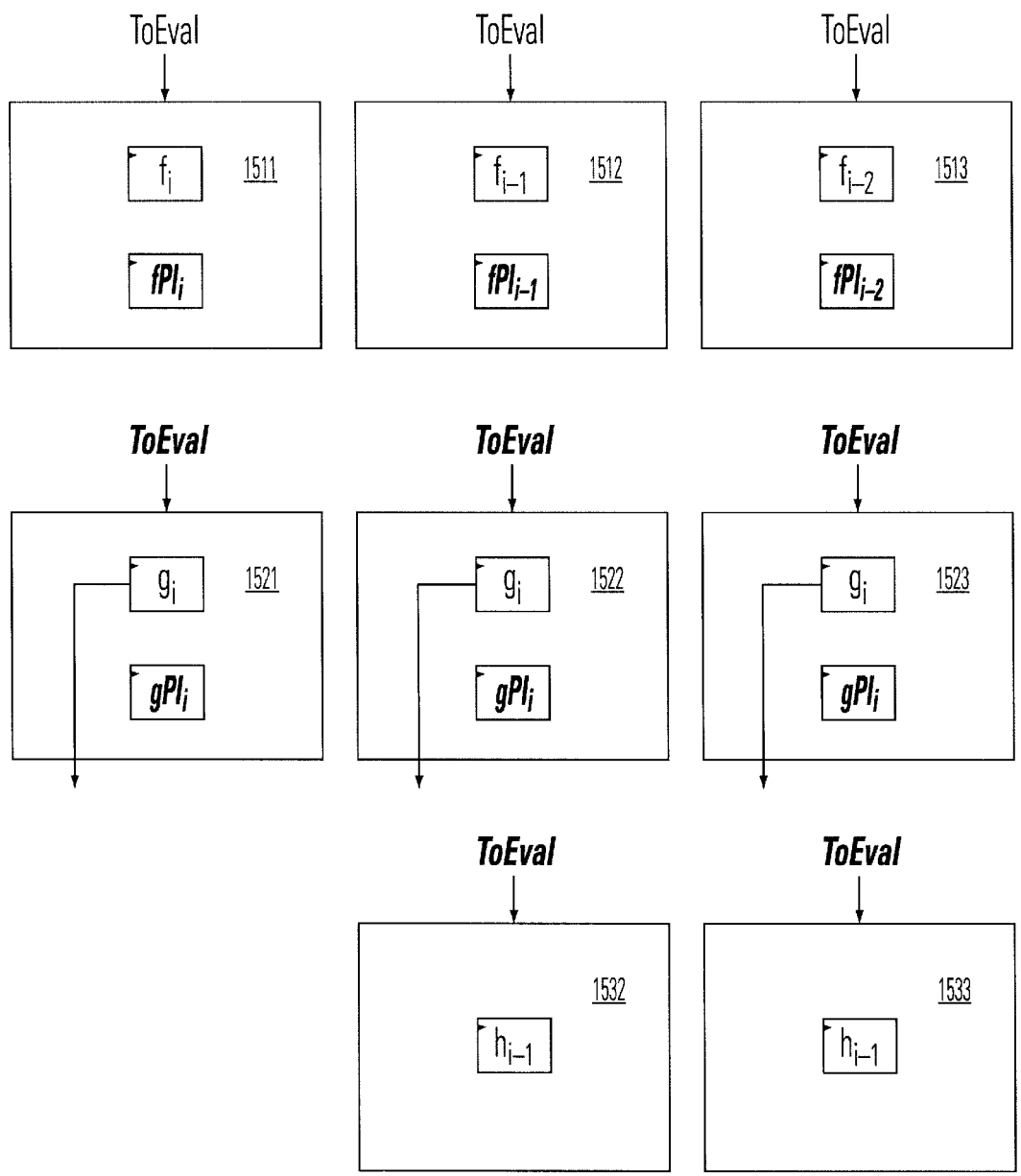

FIG. 18 depicts the flow of data from the Euclid's algorithm array to the error evaluator array in response to control signal ToEval. Data is transferred only from the second cells. Data from the higher order second cells is transferred to the corresponding Ω sub array cells. Data from the lower order second cells is transferred to the Λ sub array cells.

Figure 19:
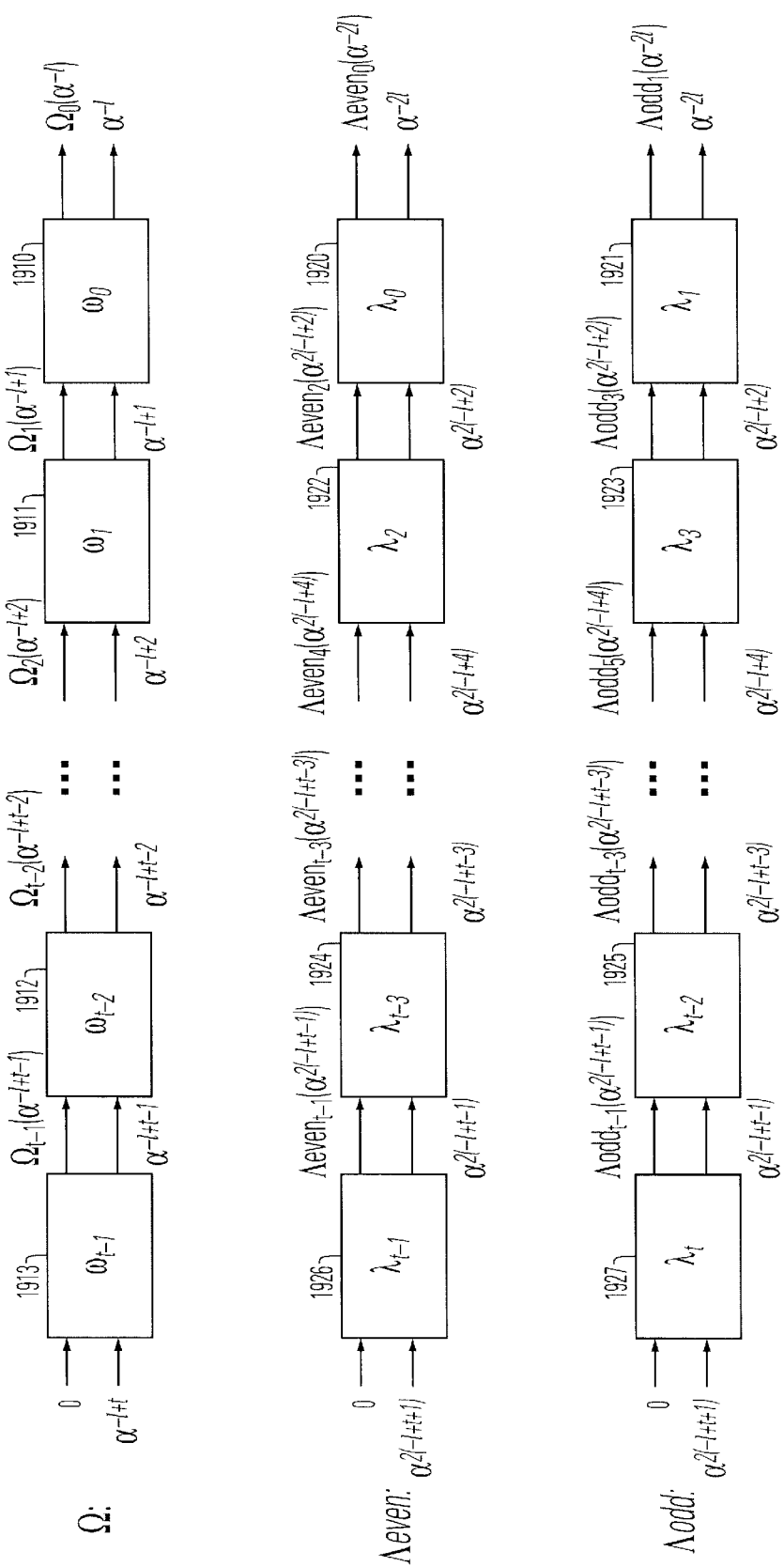
FIG. 19 is an overview diagram of an error evaluator array architecture, including $\Omega$, $\Lambda$even and $\Lambda$odd sub arrays, which embodies the principles of the present invention.

FIG. 19 provides an overview of data flow within the error evaluator Ω_Λ array. This array begins its processing when the signal ToEval is enabled. The arrangement for Ω_Λ array shown in FIG. 19 consists of three sub-arrays: Ω, Λeven and Λodd. We assume here, for convenience, that 't' is an odd number. One of skill in the art will recognize that the principles of this invention apply equally well when 't' is an even number. The sub-array Ω, consisting of cells $\omega_{t-1}$, $\omega_{t-2}, \ldots, \omega_0$ 1910 to 1913, is for the evaluation of Ω(x). The sub-array Λeven, consisting of cells $\lambda_{t-1}, \lambda_{t-3}, \ldots, \lambda_2, \lambda_0$ 1920, 1922, 1924 & 1926, is for the evaluation of Λeven($x^2$). Λodd subarray, consisting of cells $\lambda_t, \lambda_{t-2}, \ldots, \lambda_3, \lambda_1$ 1921, 1923, 1935 & 1927, is for the evaluation of Λodd(x), or Λ'(x). Recall that Λ(x) can be obtained from Λodd($x^2$) by multiplying it by x and adding the result with Λeven($x^2$). Thus, we need only these two sub-arrays Λeven and Λodd to evaluate both Λ(x) and Λ'(x).

Calculation in the structure depicted in FIG. 19 proceeds as indicated in the following equations:

$$\Omega_k(x) = \sum_{i=k}^{t-1} \omega_i x^{i-k},$$

with k=(t−1), (t−2), . . . , 1, 0;

$$\Lambda even_k(x^2) = \sum_{\substack{i=k \\ even}}^{t-1} \lambda_1 x^{i-k} = \sum_{j=0} \lambda_{2j+k} x^{2j},$$

with k=(t−1), (t−3), . . . , 2, 0; and $$\Lambda odd_k(x^2) = \sum_{\substack{i=k \\ odd}}^{t} \lambda_1 x^{i-k} = \sum_{j=0} \lambda_{2j+k} x^{2j},$$

with k=t, (t−2), . . . , 3, 1. The coefficients $\omega_i$ and $\lambda_i$ are stored in corresponding cells of the subarrays. Data flows through the arrays, accumulating the sums indicated by these equations.

The three sub-arrays apply Horner's rule, as in the syndrome computation. However, there is a difference in the systolic design of the syndrome and error evaluation calculators. In applying Horner's rule, set forth above, the two arguments are a factor, e.g., $\alpha^i$ and a vector of values, e.g., $r_0 \ldots N-1$. Syndrome computation proceeds with each cell being initialized with the factor ($\alpha^{-i}$) and iterating through the vector of values. As a result, each cell applies Horner's rule to produce a result. Error evaluation proceeds with each cell being initialized with a value from the vector, instead of being initialized with a factor. Factors ($\alpha^{-l}$ or $\alpha^{-2l}$) are generated outside the cells. Computation proceeds as each factor and intermediate result are passed from cell to cell, where they are combined with the vector value in each successive cell. Application of Horner's rule is complete when a factor has passed through all of the cells, with only the last cell producing a result. FIG. 19 depicts this data flow through each of the three sub arrays.

Figure 20:
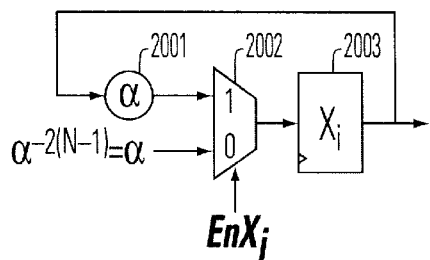
FIGS. 20–21 are a logic diagrams for a Galois Field constant multiplier to generate powers of $\alpha$ and of $\alpha^2$.
Figure 21:
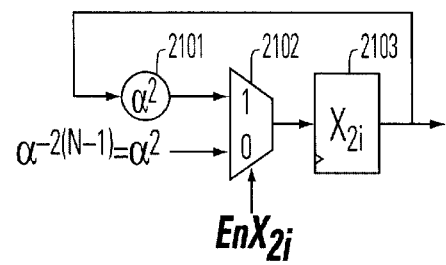

FIGS. 20 and 21 illustrate how the factors $\alpha$ and $\alpha^2$ are generated external to the third cells. These figures are identical, except that the factors in the constant multipliers 2001 and 2101 are $\alpha^{-l}$ and $\alpha^{-2l}$, respectively. In FIG. 20, the mux 2002 is responsive to control signal $EnX_i$. When the control signal is in a first state, an initial value is output by mux 2002 to storage 2003. When the control signal is an opposite state, the circuit generates a power of the factor. The value in storage 2003 is input to constant multiplier 2001, which is connected to mux 2002, the output of which is loaded back into storage 2003. With each cycle, the order of magnitude of the value in storage 2003 increases by one. Similarly, with each cycle, the order of magnitude of the value in storage 2103 increases by two.

Figure 22:
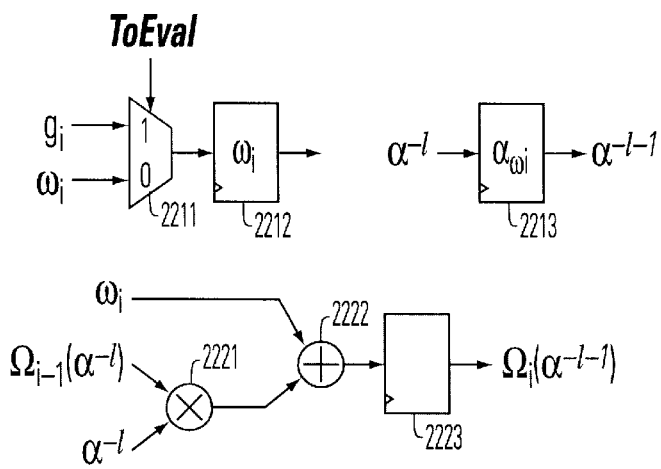
FIGS. 22 and 23 are logic diagrams for Ω and Λ cells in the error evaluator array architecture which embodies the principles of the present invention.
Figure 23:
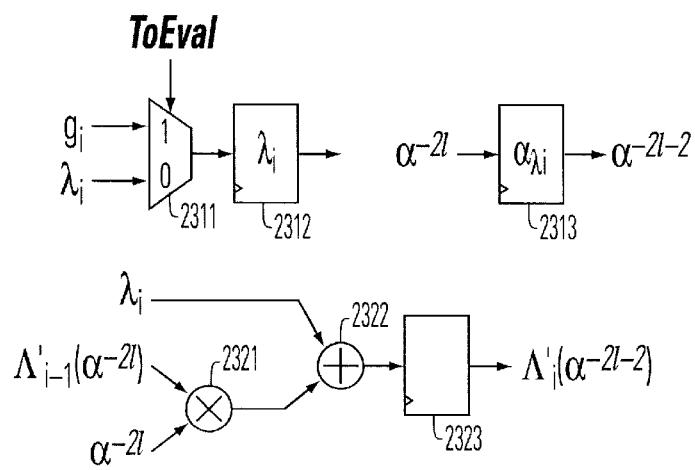

FIGS. 22 and 23 depict the parallel logic operating in cells of the error location and error evaluator polynomial arrays. The logic in these figures is identical. Blocks 2211 and 2212 depicts the initialization of an Omega array cell with a value from the Euclid's algorithm array. Mux 2211 is responsive to control signal ToEval. When this control signal is in a first state, an initial value is transferred from second array cell $g_i$ to storage in $\Omega(x)$ cell $\omega_i$ 2212. When the control signal is in the opposite state, the current value in storage 2212 passes through mux 2211 back into storage. Block 2213 illustrates the delay in fact of the storage element. When the value of $\alpha^{-l}$ is input into storage 2213, the value $\alpha^{-l-1}$ is output from the same storage.

The main logic of a cell in the $\Omega$_$\Lambda$ sub arrays appears in the part of FIG. 22 labeled 2221–2223. The inputs of Galois Field adder 2221 are a partial value of $\Omega_{i-1}(\alpha^{-l})$ and the value $\alpha^{-l}$ at which $\Omega(x)$ is being evaluated. The output of 2221 is combined with the constant $\omega_i$ by the Galois Field adder 2222. The output of this adder is connected to storage 2223. At the same time that the value $\Omega_{i-1}(\alpha^{-l})$ is loaded into storage 2223, the prior value $\Omega_i(\alpha^{-l-1})$ is output. Parallel operations can be traced through FIG. 23, where logic elements are numbered in parallel with FIG. 22.

Figure 24:
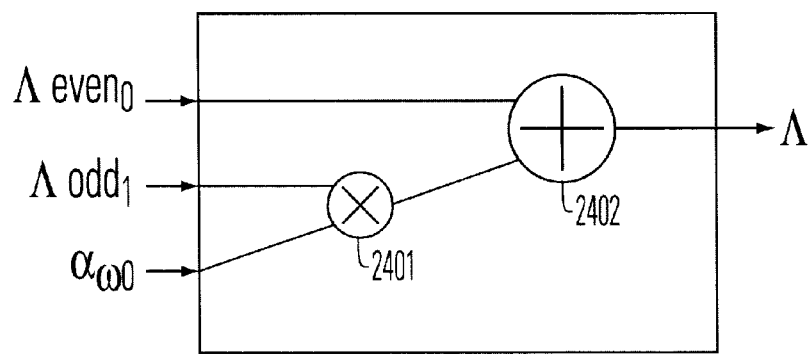
FIGS. 24 and 25 are logic diagrams for combining results from first cell(0), second cell(1) and second cell(0) to determine whether an error is located at a particular term of the message and, if so, the value of the error.
Figure 25:
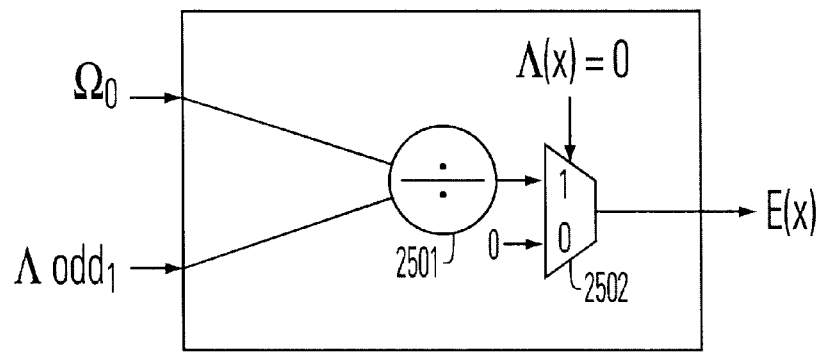

FIGS. 24 and 25 depict how outputs of the lowest order cells in each of the three sub arrays are combined to generate the error location and error evaluator polynomials. In FIG. 24, the inputs to Galois Field multiplier 2401 are the output from the lowest order $\Lambda$odd cell and the factor value at which $\Lambda$odd is evaluated. The output of multiplier 2401 is combined with output from the lowest order $\Lambda$even cell by Galois Field adder 2402. This output is an evaluation of the error location polynomial at a particular location. When this output is "0", the error value for this position is calculated by Galois Field divider 2501 as depicted in FIG. 25.

Figure 26:
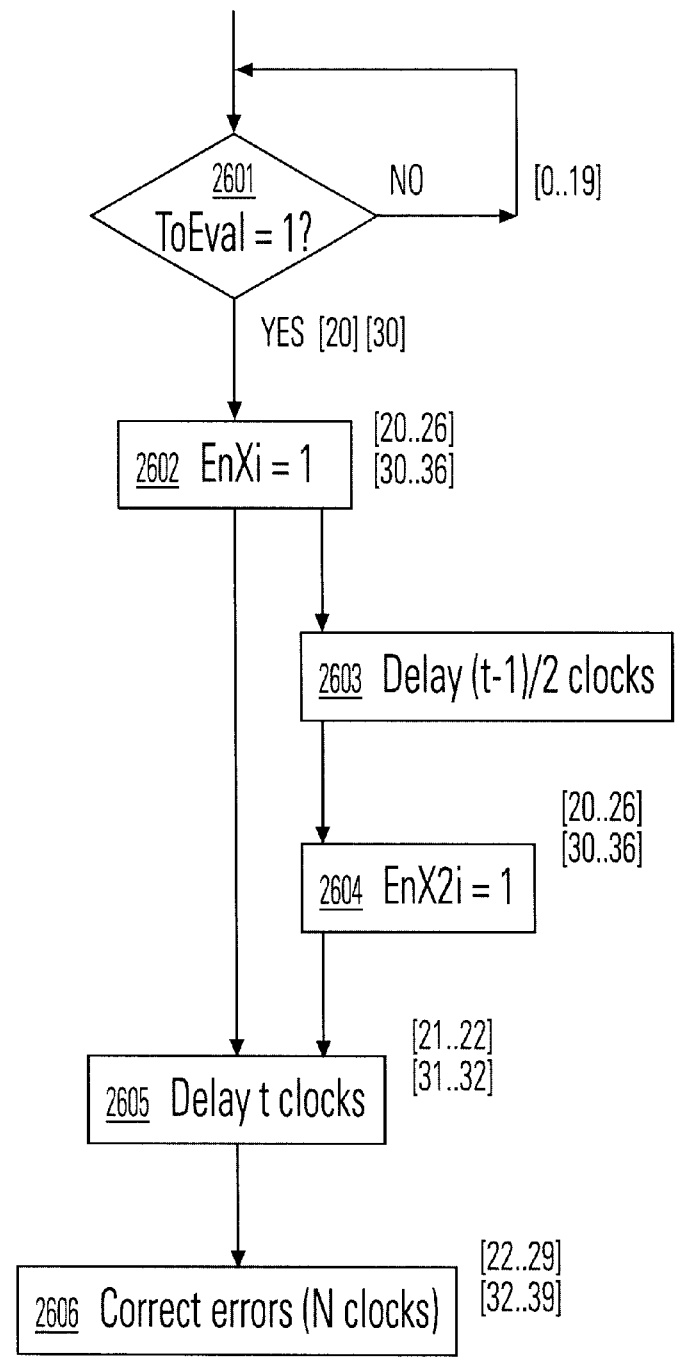
FIG. 26 is a control flow chart for error location polynomial evaluation.

FIG. 26 depicts one control logic for the evaluation computation. As with FIGS. 8 and 13, numeric sequences appear in square brackets adjacent to the logic blocks of this figure. These bracketed numbers correspond to the time line numbers along the top of FIG. 32. In FIG. 26, the process begins in block 2601 with a test of the control signal ToEval. If the control signal is false, the process waits. When the signal is true, control passes to block 2602. This block represents enabling control signal EnXi, which initiates the process of evaluating $\Omega(x)$. From block 2602, processing proceeds along two paths. Because the even and odd components of $\Lambda(x)$ are calculated in parallel, the evaluation of $\Omega(x)$ begins before the evaluation of $\Lambda(x)$. Along one path, the process flows from 2602 to delay element 2603. Enablement of control signal $EnX_{2i}$ is delayed so that the results of evaluating $\Omega(x)$ and $\Lambda(x)$ will be generated the same time. After the delay in 2603, the second control signal $EnX_{2i}$ is enabled in block 2604. Processing proceeds in parallel along two paths. These paths from block 2602 and through block 2604 converge at block 2605, which indicates that the control signals remain enabled for a predetermined number of cycles. From block 2605, the process proceeds to block 2606 where terms of the error polynomial E(x) are sequentially output in N clock cycles.

To illustrate the operation of the device and method embodying the present invention, two examples are provided in FIGS. 27–29 and FIGS. 30–32. The same original message is used in both examples. The errors are different. The error in the first example never results in enablement of the control signal ShiftG. The error in the second example, while simpler, exercises all of the control signals.

Now consider a (7, 3) RS code over $GF(2^3)$ with N=7 and K=3. This code has the ability of correcting t=2 errors. The representation of the field $GF(2^3)$ is given in FIG. 1. The generator polynomial is $$G(x) = \prod_{i=1}^{4} (x - \alpha^i) = x^4 + \alpha^3 x^3 + x^2 + \alpha x + \alpha^3.$$

Assume the message polynomials is $M(x)=\alpha^5 x^2+\alpha^3 x+\alpha^6$. The encoded code word polynomial is $C(x)=\alpha^5 x^6+\alpha^3 x^5+\alpha^6 x^4+\alpha^5 x^3+x^2+x+\alpha^3$. Suppose that two errors occur as the error polynomial $E(x)=\alpha^2 x^4+1$. Then the received polynomial is $R(x)=\alpha^5 x^6+\alpha^3 x^5+x^4+\alpha^5 x^3+x^2+x+\alpha$.

Figure 27:
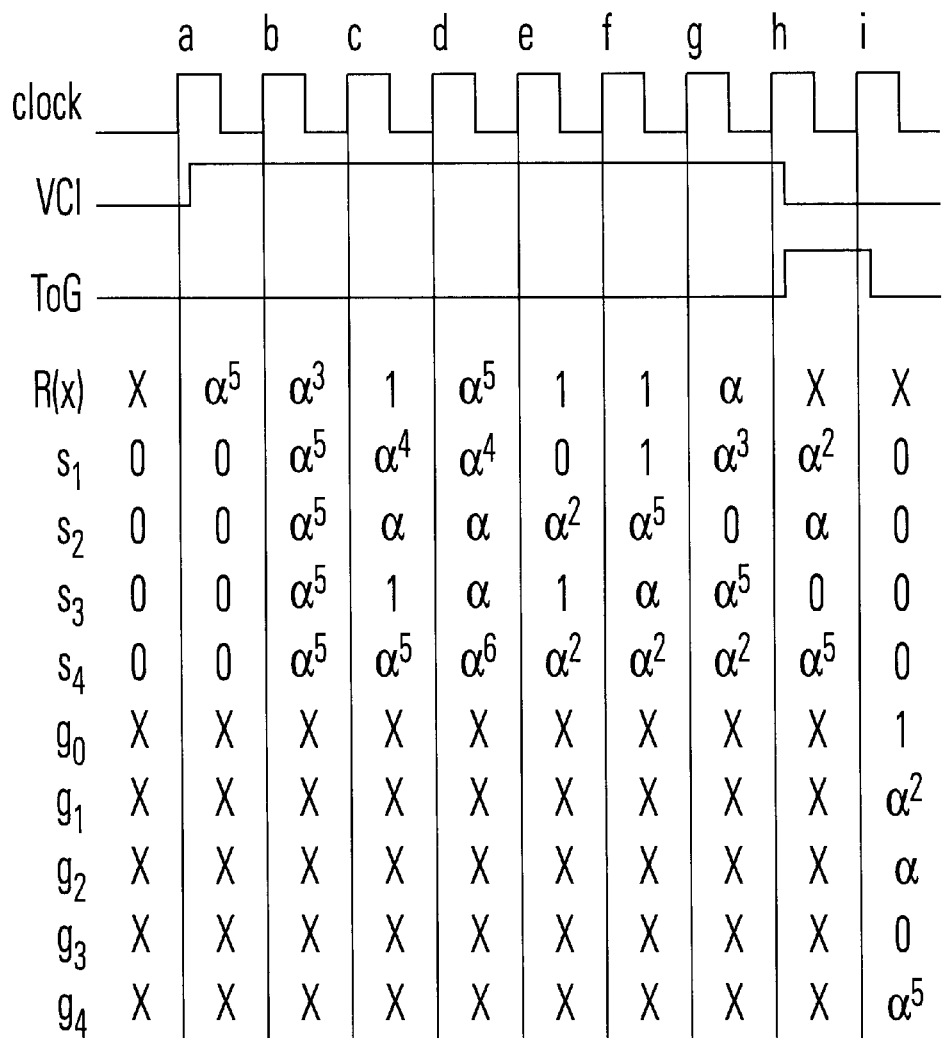

FIG. 27 shows the timing and operations for the computation of syndromes. At clock edge a, the signal VCI is enabled and the received code is ready. We see that, initially, $S_1$, $S_2$, $S_3$ and $S_4$ are all zero. Then from clock edge b to clock edge h, for each $s_i$, the Horner's rule is applied. For example, at clock edge b, $s_1$ is calculated at $(0\alpha+\alpha^5)=\alpha^5$. Then at clock edge c, $s_1$ is $(\alpha^5\alpha+\alpha^3)=\alpha^4$, and so on. Finally, computation of syndromes is completed at clock edge h and the signal ToG is enabled. Then at clock edge i, the contents of $s_1$, $s_2$, $s_3$ and $s_4$ are loaded into $g_1$, $g_2$, $g_3$ and $g_4$, respectively and $g_0$ is set 1. Application of Euclid's algorithm follows.

Figure 28:
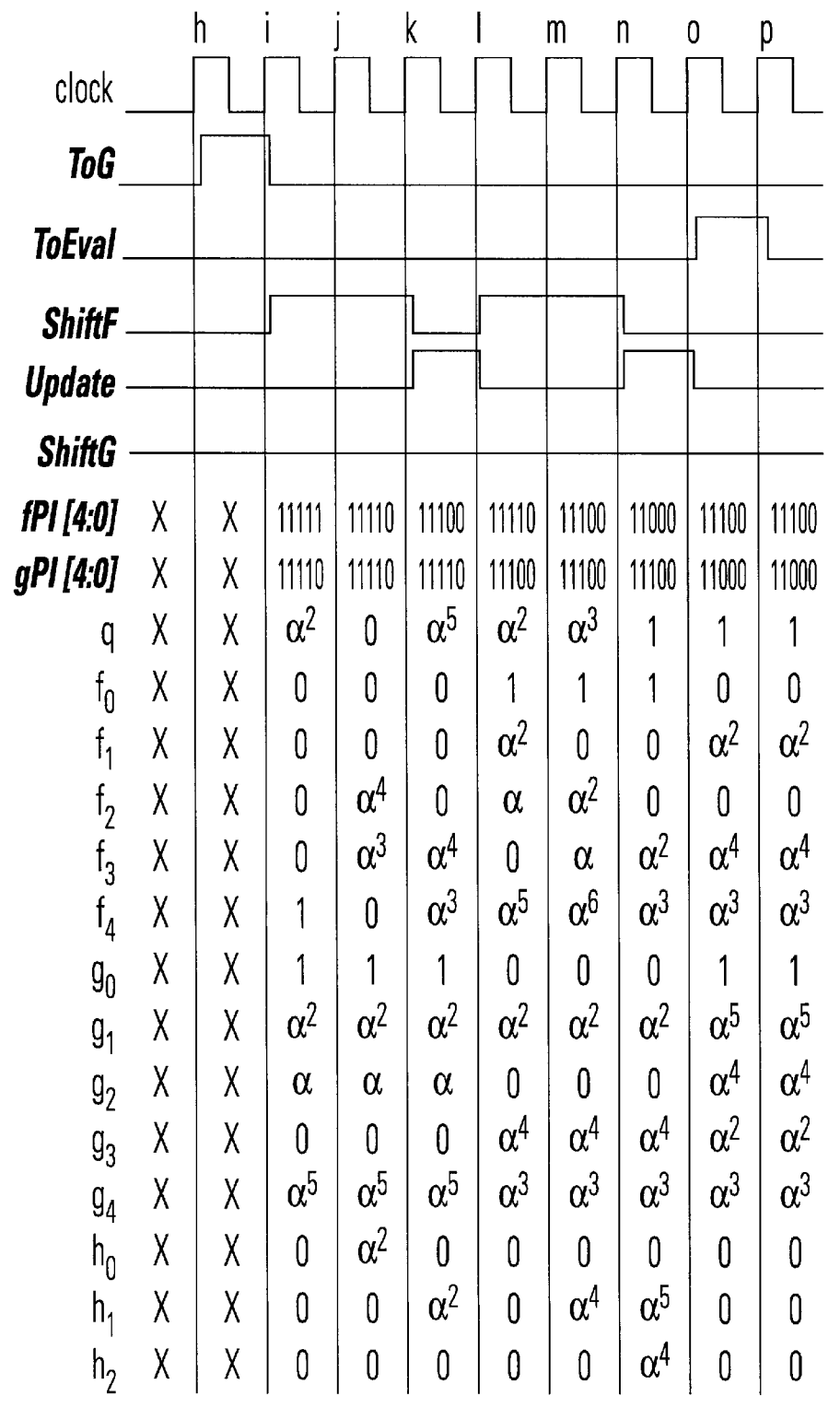

FIG. 28 shows the timing and operations for the application of Euclid's algorithm. Initially, when the signal ToG is enabled, at clock edge i, the array is initialized. Note, the sum of fPI[4:0] minus 1 corresponds to the degree of the $\Omega^{(k-2)}(x)$ polynomial in the higher order F array cells, likewise for the $\Omega^{(k-1)}(x)$ polynomial i the highest order G array cells. Thus, at clock edge i, the degree of the f polynomial is greater than that of the g polynomial, and the leading coefficient $g_4$ of the g polynomial is not zero, so that the signal ShiftF is enabled to perform the division. At clock edge j, for $f_4$, we have $(0\&1+\alpha^2 0\&1+1\&~1)=0$. At clock edge k, the degree of the f polynomial is (3−1)=2, which is less than that of the g polynomial, that is (4−1)=3. Therefore, the signal Update is enabled to interchange terms between the rows of first and second cells. After that, the operation of division is performed again. When the degree of the f polynomial is reduced by division to less than that of the g polynomial, the signal Update is again enabled. Finally, at clock edge o, the degree of the g polynomial, which is (2−1)=1, is less than t=2, so that the algorithm stops and the signal ToEval is enabled. At clock edge p, the contents of $g_0$, $g_1$, $g_2$, $g_3$ and $g_4$ are transferred into $\lambda_0$, $\lambda_1$, $\lambda_2$, $\omega_0$, and $\omega_1$, respectively, as shown in FIG. 29, and the evaluation stage begins.

FIG. 29 shows the timing and operations for the evaluation of $\Omega(x)$, $\Lambda(x)$, and $\Lambda'(x)$. At clock edge p, signals $EnX_i$ and $EnX_{2i}$ are enabled to generate the sequences $x_i=\alpha^{-i}$ and $x_{2i}=\alpha^{-2i}$, for i from (7−1)=6 to 0. The evaluation is similar to the computation of syndromes, with the distinction explained above. At clock edge t, $\Omega_0(x)$ is evaluated as $(\alpha^3\alpha^3+\alpha^2)=1$, which is $\Omega(\alpha^3)$ or $\Omega(\alpha^{-4})$. Evaluating $\Lambda(x)$, at clock edge t, we have $\Lambda(\alpha^3)=\alpha^3\Lambda_{odd1}(\alpha^4)+\Lambda_{even0}(\alpha^4)$, namely, $\Lambda(\alpha^3)=\alpha^3\alpha^5+\alpha=0$. There is an error at this location. The error value is computed as $e_4=1/\alpha^5=\alpha^2$. This example illustrates much of the present invention, but not all.

Figure 30:
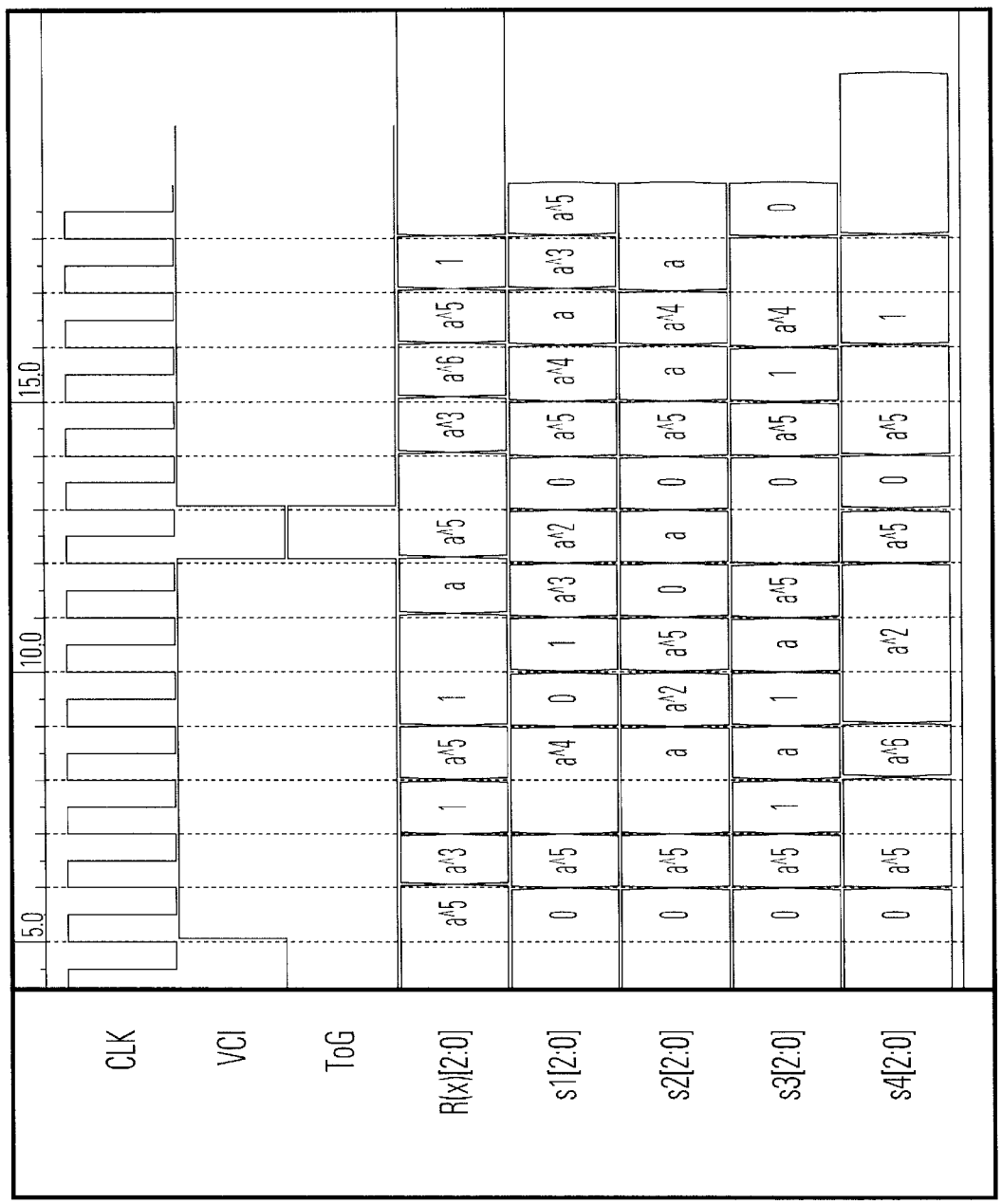
FIG. 30 is Euclid's algorithm evaluation.
Figure 31:
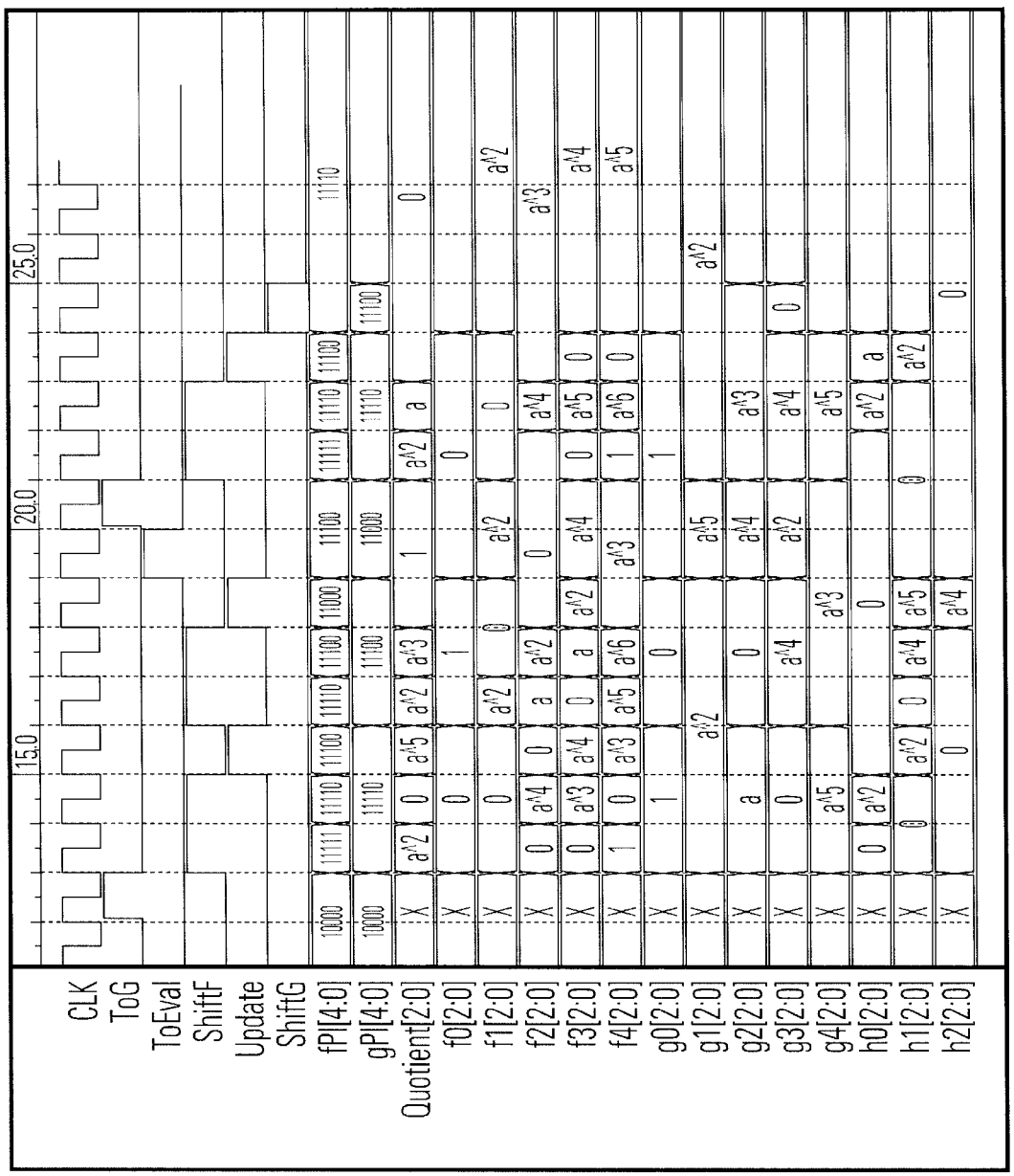
FIG. 31 is evaluation of the error location and error evaluation polynomials.
Figure 32:
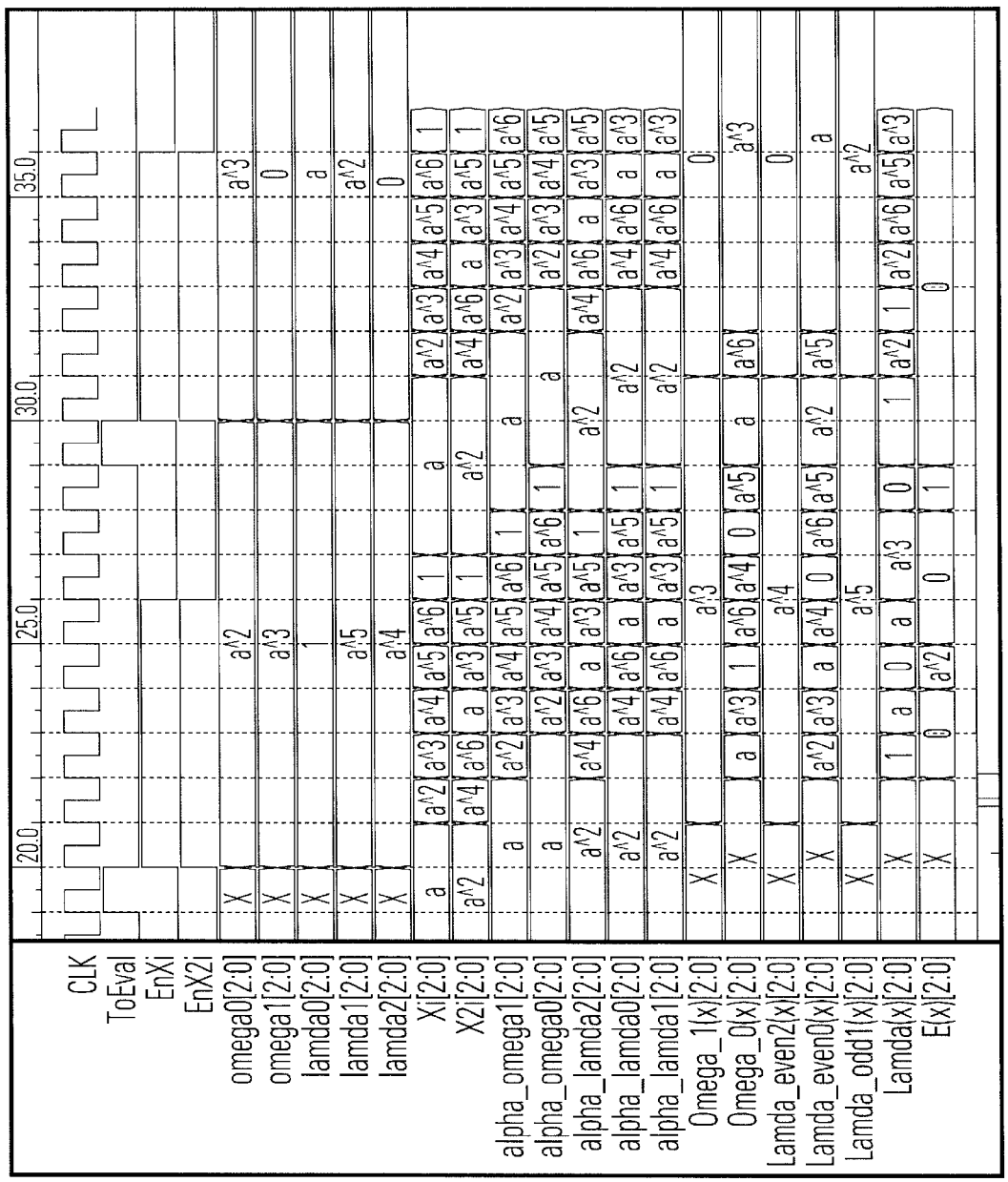

The second example is shown in FIGS. 30–32. In the second example, the message and code polynomials are as in the first example. The error is $\alpha x$, so the received polynomial is $R(x)=\alpha^5 x^6+\alpha^3 x^5+\alpha^6 x^4+\alpha^5 x^3+x^2+\alpha^3 x+\alpha^3$. FIGS. 30–32 track the decoding process through receipt of two code words, instead of just one. These figures were generated by a circuit simulator. The first received code word is taken from the first example above and the second code word is for this second example.

FIG. 30 shows the computation of syndromes. At time 5, the signal VCI is enabled to start sending the first received code word, and then at time 12, it is disabled to signify that it is the end of the code word. At time 13, it is enabled again to start sending the second received code word, and then at time 20, it is disabled to end the sending second received code word. The received code words can be fed into the decoder continuously only if the signal VCI is disabled for one or more clock periods to distinguish between code words.

In FIG. 31, the sequence from time 12 to time 20 is the same as in FIG. 27, depicting the processing of the same first received code word as used in the first example. From time 20 to time 30, FIG. 31 shows the processing of a second received code word for the second example. At time 24, $g_4$ is zero, so ShiftG is enabled and ShiftF is not enabled. This is where the example exercises the ShiftG control signal. At time 25, $g_4$ is also zero and ShiftG is not enabled, because, at this time, the degree of $\Omega_{j-1}(x)$, that is the sum(gPI[4:0])–1, is less than t=2 and iteration terminates.

In FIG. 32, from sequence from time 19 to time 29, is same with those in FIG. 28, processing the first received code word. From time 29 to time 39, FIG. 32 shows the processing of the second received code word. The error polynomial E(x) is correctly computed, as can be seen by comparing the result of the simulation to the assumed error term.

The devices and methods described above are of low complexity and operate in a small number of cycles. None of the cells described above require more than one multiplier. No multiplier produces more than one product per iteration, in contrast to Berlekamp, who produces two products from his multiplier, thereby requiring three cycles to perform what this device and method requires one cycle to perform. Compare, Berlekamp, Chapter 10, pp. 227–28. An elegant parallel computation architecture has several advantages. The complexity of the timing required is reduced, as compared to Berlekamp, for instance. Fewer cycles are required to decode a message. This increases throughput and reduces the amount of buffer storage required for received messages awaiting error correction. A cell-based design with data flow primarily to adjacent cells leads to an efficient footprint on a chip. This design is intended to be applicable to long or short codes, full or shortened codes. The complexity of the architecture grows linearly with the minimum distance or error correction capability of the code. More execution time is required for longer messages, but architectural complexity does not increase unless the error correction capability of the code increases. Additional advantages will be apparent to those skilled in the art.

The foregoing description of various embodiments of the invention have been presented for purposes of illustration and description. The description is not intended to limit the invention to the precise forms disclosed. Many modifications and equivalent arrangements will be apparent to people skilled in the art.

What is claimed is:

1. A syndrome calculation device for decoding Reed-Solomon (N, K) encoded messages with m-bit symbols, where $N<=2^m-1$ and $2t=N-K$, comprising:
   a serial input for a message;
   a parallel output;
   a set of 2t syndrome calculation cells each coupled to said serial input and said parallel output, wherein the syndrome calculation cell$_j$ includes:
   a syndrome register having an output coupled to the parallel output;
   a constant multiplier for a constant $\alpha^j$, with its input coupled to the syndrome register;
   an adder with its inputs coupled to the serial input and the constant multiplier;
   a mux with its inputs coupled to a constant 0 and the adder and its output coupled to the syndrome register.

2. The device of claim 1, wherein the mux is responsive to a syndrome calculate signal.

3. A device to divide polynomials over a Galois Field $GF(2^m)$ to decode a Reed-Solomon (N, K) encoded message of m-bit symbols, where $N<=2^m-1$ and $N-K=2t$, comprising:
   a dividend polynomial array of first cells j=2t to 0, wherein first cell$_j$ is coupled to first cell$_{j-1}$ for j=2t to 1;
   a divisor polynomial array of second cells j=2t to 1, wherein first cell$_j$ for j=2t to 2 is coupled to second cell$_{j-1}$;
   a shared divider with its inputs coupled to first cell$_{2t}$ and second cell$_{2t}$ and its output coupled to the first cells; and
   logic to calculate a quotient of first cell$_{2t}$ divided by second cell$_{2t}$ and a remainder polynomial equal to the dividend polynomial minus (said quotient times the divisor polynomial).

4. The device of claim 3, wherein the logic to calculate produces the quotient and the remainder in a single clock cycle.

5. The device of claim 3, wherein the first cells include only one multiplier per first cell.

6. The device of claim 3 further including a quotient polynomial array of third cells j=t to 0, wherein third cell$_j$ for j=t to 1 is coupled to third cell$_{j-1}$ and third cell$_0$ is coupled to the shared divider.

7. The device of claim 6, wherein the second and third cells do not include any multipliers.

8. A device to apply Euclid's algorithm to decode a Reed-Solomon (N, K) encoded message of m-bit symbols and corresponding syndromes, where $N<=2^m-1$ and $N-K=2t$, comprising:
   a dividend polynomial array of 2t+1 first cells, wherein first cell$_j$ is coupled to first cell$_{j-1}$;
   a divisor polynomial array of 2t+1 second cells, wherein second cell$_j$ is coupled to first cell$_j$ and first cell$_{j+1}$, and to second cell$_{j-1}$;
   an array of t+1 third cells, wherein third cell$_j$ is coupled to first cell$_j$, second cell$_j$ and third cell$_{j-1}$;
   a shared divider with its inputs coupled to first cell$_{2t}$ and second cell$_{2t}$ and its output coupled to the first cells;
   logic to calculate a quotient of first cell$_{2t}$ divided by second cell$_{2t}$ and a remainder polynomial of the dividend polynomial minus (said quotient times the divisor polynomial).

9. A device to apply Euclid's algorithm to decode a Reed-Solomon (N, K) encoded message of m-bit symbols and corresponding syndromes S(x), where $N<=2^m-1$ and $N-K=2t$, comprising:

an array of 2t+1 first cells, 2t+1 second cells and t+1 third cells;

a shared divider coupled to the array, to divide first $cell_{2t}$ and second $cell_{2t}$ and output a quotient to the first cells;

logic to partition the first cells to represent polynomials $\Omega^{(k-2)}(x)$ and $\Lambda^{(k-2)}(x)$ and to partition the second cells to represent polynomials $\Omega^{(k-1)}(x)$ and $\Lambda^{(k-1)}(x)$, where k is an index of iteration; and logic to calculate $\Lambda^{(k)}(x)=\Lambda^{(k-2)}(x)-[Q^{(k)}(x)\otimes\Lambda^{(k-1)}(x)]$ and $\Omega^{(k)}(x)=\Omega^{(k-2)}(x)-[Q^{(k)}(x)\otimes\Omega^{(k-1)}(x)]$, where $Q^{(k)}(x)=\Omega^{(k-2)}(x)\otimes\Omega^{(k-1)}(x)$.

10. The device of claim 9, wherein the initial values at k=1 are $\Lambda^{(-1)}(x)=0$, $\Lambda^{(0)}(x)=1$, $\Omega^{(-1)}(x)=x^{2t}$, and $\Omega^{(0)}(x)=S(x)$.

11. The device of claim 9, further wherein the logic to calculate iterates until the degree of the of $\Omega^{(k-1)}(x)<t$.

12. The device of claim 9, wherein the first cells include no more than one multiplier each.

13. The device of claim 12, where the first cells include logic which exercises the multiplier only once to calculate said difference.

14. A device for decoding Reed-Solomon (N, K) encoded messages with m-bit symbols, where $N<=2^m-1$ and $2t=N-K$, comprising:

an array of first cells, logically partitioned into $\Omega^{(i-2)}$ and $\Lambda^{(i-2)}$ cells, said first cells coupled to adjacent first cells;

an array of second cells, logically partitioned into $\Omega^{(i-1)}$ and $\Lambda^{(i-1)}$ cells, said second cells coupled to corresponding and next higher order first cells and to adjacent second cells;

an array of third cells, said third cells coupled to the corresponding first and second cells and to adjacent third cells;

a shared divider coupled to first cells;

logic associated with the first, second and third cells to calculate a quotient $q=\Omega^{(i-2)}/\Omega^{(i-1)}$ and a remainder of the quotient;

logic associated with the first, second and third cells to calculate $\Omega^{(i)}=\Omega^{(i-2)}-Q^{(k)}\Omega^{(i-1)}$; and logic associated with the first, second and third cells to calculate $\Lambda^{(i)}=\Lambda^{(i-2)}-Q(k)\Lambda^{(i-1)}$.

15. A device for evaluating a t-term error location polynomial and a t-term error evaluator polynomial to decode Reed-Solomon (N, K) encoded messages with m-bit symbols, where $N<=2^m-1$ and $2t=N-K$, comprising:

an array of t $\Omega$ cells initialized with an error location polynomial;

an array of t $\Lambda$ cells initialized with an error evaluator polynomial, said array of $\Lambda$ cells including $\Lambda$even and $\Lambda$odd sub arrays;

a first constant factor generator coupled to the highest order cell of the $\Omega$ array;

a second constant factor generator coupled to the highest order cell of the $\Lambda$even and $\Lambda$odd sub arrays;

logic to pass first constant factors values serially through the $\Omega$ array cells and to evaluate $\Omega(x)$ at values of $x^k$ generated by the first constant factor generator, where k is an index of iteration; and logic to pass second constant factors serially through both the $\Lambda$even array and the $\Lambda$odd array and to evaluate $\Lambda$even$(x^2)$ and $\Lambda$odd$(x^2)$ at values of $x^{2k}$ generated by the second constant factor generator.

16. The device of claim 15, further including logic evaluate $\Lambda(x)=\Lambda$even$(x^2)+x\,\Lambda$odd$(x^2)$ at $x^{2k}$ and, when $\Lambda(x)=0$ to evaluate $E(x)=\Omega(x)/\Lambda$odd$(x^2)$.

17. A device for decoding Reed-Solomon (N, K) encoded messages with m-bit symbols, where $N<=2^m-1$ and $2t=N-K$, comprising:

syndrome calculation means for calculating a syndrome polynomial of a received Reed-Solomon (N, K) encoded message;

an array of 2t+1 first cells, logically partitioned into $\Omega(i-2)$ and $\Lambda(i-2)$ cells, said first coupled to adjacent first cells;

an array of second cells, logically partitioned into $\Omega(i-1)$ and $\Lambda(i-1)$ cells, said second cells receiving the syndrome polynomial from the syndrome calculation means and being coupled to the corresponding and next higher order first cells and to adjacent second cells;

an array of third cells, said third cells coupled to the first and second cells and to adjacent the third cells;

a shared divider coupled to the first and third cells;

logic associated with the first, second and third cells to apply Euclid's algorithm and generate an error location and an error value polynomial;

Chien search means for identifying elements of GF(2^m) which are roots of the error location polynomial, coupled to the logic to generate an error location polynomial; and error evaluation means for evaluating the error value polynomial at roots of the error location polynomial, coupled to the logic to generate an error value polynomial and to the Chien search means.

\* \* \* \* \*